(12) United States Patent
Zhao et al.

(10) Patent No.: US 12,112,673 B2
(45) Date of Patent: Oct. 8, 2024

(54) DISPLAY PANEL AND DISPLAY DEVICE

(71) Applicants: Beijing BOE Display Technology Co., Ltd., Beijing (CN); BOE TECHNOLOGY GROUP CO., LTD., Beijing (CN)

(72) Inventors: Chongyang Zhao, Beijing (CN); Yingmeng Miao, Beijing (CN); Zhihua Sun, Beijing (CN); Feng Qu, Beijing (CN); Xiaochun Xu, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 121 days.

(21) Appl. No.: 17/796,660

(22) PCT Filed: Jun. 10, 2021

(86) PCT No.: PCT/CN2021/099278
§ 371 (c)(1),
(2) Date: Jul. 31, 2022

(87) PCT Pub. No.: WO2022/022095
PCT Pub. Date: Feb. 3, 2022

(65) Prior Publication Data
US 2023/0335029 A1 Oct. 19, 2023

(30) Foreign Application Priority Data
Jul. 31, 2020 (CN) .......................... 202010763145.2

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2300/0408* (2013.01); *G09G 2310/0202* (2013.01); *G09G 2310/0286* (2013.01)

(58) Field of Classification Search
CPC ............. G09G 3/20; G09G 2300/0408; G09G 2310/0202; G09G 2310/0286;
(Continued)

(56) References Cited

U.S. PATENT DOCUMENTS 9,934,749 B2  4/2018  Yu
10,657,879 B1  5/2020  Gu et al.
(Continued)

FOREIGN PATENT DOCUMENTS

CN  101345030 A  1/2009
CN  102024500 A  4/2011
(Continued)

OTHER PUBLICATIONS

China Patent Office, First Office Action dated Feb. 7, 2023, for corresponding Chinese application 202010763145.2.

*Primary Examiner* — Matthew A Eason
*Assistant Examiner* — Chayce R Bibbee
(74) *Attorney, Agent, or Firm* — HOUTTEMAN LAW LLC

(57) ABSTRACT

The present disclosure provides a display panel and a display device. The display panel includes p pixel unit groups, and each of the p pixel unit groups includes q rows of pixel units, both p and q being integers greater than or equal to 2. Pixel units in a same group are simultaneously supplied with a gate scan signal by a same shift register, and pixel units in a same group and in a same column are supplied with data voltage signals through different data lines, respectively.

18 Claims, 24 Drawing Sheets

(58) Field of Classification Search
CPC ......... G09G 3/3266; G09G 2310/0267; G09G 3/3677; G11C 19/28
See application file for complete search history.

(56) References Cited

U.S. PATENT DOCUMENTS

| | | | |
|---|---|---|---|
| 2010/0277206 A1* | 11/2010 | Lee | G11C 19/184 327/108 |
| 2011/0150169 A1 | 6/2011 | Lin et al. | |
| 2017/0169784 A1* | 6/2017 | Xiao | H01L 27/124 |
| 2018/0068630 A1 | 3/2018 | Xiao et al. | |
| 2018/0204496 A1 | 7/2018 | Zhang et al. | |
| 2020/0020263 A1* | 1/2020 | Shin | G02F 1/13458 |
| 2020/0035184 A1 | 1/2020 | Luo et al. | |
| 2021/0193006 A1 | 6/2021 | Wang et al. | |
| 2021/0225243 A1 | 7/2021 | Guan | |
| 2022/0005417 A1 | 1/2022 | Feng et al. | |

FOREIGN PATENT DOCUMENTS

| | | |
|---|---|---|
| CN | 103185976 A | 7/2013 |
| CN | 105139796 A | 12/2015 |
| CN | 105551423 A | 5/2016 |
| CN | 105575318 A | 5/2016 |
| CN | 105869563 A | 8/2016 |
| CN | 107393461 A | 11/2017 |
| CN | 108573667 A | 9/2018 |
| CN | 108877722 A | 11/2018 |
| CN | 109559674 A | 4/2019 |
| CN | 109712553 A | 5/2019 |
| CN | 109920390 A | 6/2019 |
| CN | 109935208 A | 6/2019 |
| CN | 109935212 A | 6/2019 |
| CN | 109994064 A | 7/2019 |
| CN | 110148390 A | 8/2019 |
| CN | 110706639 A | 1/2020 |
| CN | 110718175 A | 1/2020 |
| JP | 2004046009 A | 2/2004 |
| WO | WO2020073471 A1 | 4/2020 |

* cited by examiner

DISPLAY PANEL AND DISPLAY DEVICE

CROSS REFERENCE TO RELATED APPLICATIONS

This is a National Phase application filed under 35 U.S.C. 371 as a national stage of PCT/CN2021/099278 filed on Jun. 10, 2021, an application claiming priority to Chinese patent application No. 202010763145.2, filed on Jul. 31, 2020, the content of each of which is incorporated herein by reference in its entirety.

TECHNICAL FIELD

The present disclosure belongs to the field of display technology, and in particular relates to a display panel and a display device.

BACKGROUND

With continuous development of display technology, displays have gradually been developed toward high integration and low cost in recent years. One important technology is realization of mass production of GOA (Gate Driver on Array) technology. A TFT (Thin Film Transistor) gate switch circuit is integrated on an array substrate of a display panel by using the GOA technology to achieve scanning drive of the display panel, so that a gate driver integrated circuit can be omitted, which can not only reduce product cost from two aspects of material cost and manufacturing process, but also allow the display panel to achieve beautiful design with symmetry and a narrow bezel (i.e., a narrow border). Meanwhile, because a bonding process along a gate direction can be omitted, it is also beneficial to increasing production capacity and yield. The gate switch circuit integrated on the array substrate using the GOA technology is also referred to as a GOA circuit or a shift register circuit.

SUMMARY

Some embodiments of the present disclosure provide a display panel and a display device.

In a first aspect, an embodiment of the present disclosure provides a display panel, which includes p pixel unit groups, and each of the p pixel unit groups includes q rows of pixel units, both p and q being integers greater than or equal to 2; wherein pixel units in a same group are simultaneously supplied with a gate scan signal by a same shift register; and pixel units in a same group and in a same column are supplied with data voltage signals through different data lines, respectively.

In some embodiments, the display panel further includes N clock signal lines, N being an even number greater than or equal to 4, and p being greater than or equal to 2N; each shift register is connected to one of the N clock signal lines, and shift registers connected to different clock signal lines are different.

In some embodiments, pixel units in a same row are connected to a same gate line; each shift register includes q shift register units, and the shift register units are connected to gate lines in one-to-one correspondence.

In some embodiments, each shift register unit is connected to one of the N clock signal lines through a signal connection line, and different shift register units are connected with different signal connection lines.

In some embodiments, the q shift register units included in each shift register are connected to a corresponding clock signal line through a same signal connection line, and a plurality of shift register units included in different shift registers are connected with different signal connection lines, respectively.

In some embodiments, each shift register unit includes at least an input sub-circuit, an output sub-circuit, and a pull-up reset sub-circuit; wherein the input sub-circuit inputs, in response to an input signal input from a signal input terminal, the input signal to a pull-up node; the output sub-circuit outputs a clock signal input by a corresponding clock signal line through a signal output terminal in response to a potential of the pull-up node; and the pull-up reset sub-circuit resets the potential of the pull-up node through a turn-off level signal in response to a pull-up reset signal input from a pull-up reset signal terminal; and every adjacent N shift registers are connected to the N clock signal lines in one-to-one correspondence, and an i-th shift register and an (i+N)-th shift register are connected to a same clock signal line, where i takes 1 to p−N.

In some embodiments, in a case where a duty ratio of the clock signal is 30%, and N is an even number greater than or equal to 6, a signal input terminal of each shift register unit in first to (N−4)/2 shift registers responds to a frame start signal;

a signal output terminal of a j-th shift register unit in an M-th shift register is connected to a signal input terminal of a j-th shift register unit in an [M+(N−4)/2]-th shift register; and a pull-up reset signal terminal of a j-th shift register unit in an L-th shift register is connected to a signal output terminal of a j-th shift register unit in an [L+(N/2−1)]-th shift register; where M takes 1 to p−(N−4)/2; L takes 1 to p−(N/2−1); and j takes 1 to q.

In some embodiments, the display panel further includes N−2 redundant shift registers, the N−2 redundant shift registers are connected to N−2 clock signal lines, respectively, and each redundant shift register includes q redundant shift register units; each redundant shift register unit has the same structure as each shift register unit; wherein signal output terminals of j-th redundant shift register units in first to (N/2−1)-th redundant shift registers are connected to pull-up reset signal terminals of j-th shift register units in [p−(N/2−2)]-th to p-th shift registers, respectively; and signal output terminals of j-th redundant shift register units in N/2-th to (N−2)-th redundant shift registers are connected to pull-up reset signal terminals of the j-th redundant shift register units in the first to (N/2−1)-th redundant shift registers, respectively.

In some embodiments, in a case where a duty ratio of the clock signal is 40%, and N is an even number greater than or equal to 4;

a signal input terminal of each shift register unit in first to (N−2)/2 shift registers responds to a frame start signal;

a signal output terminal of a j-th shift register unit in an M-th shift register is connected to a signal input terminal of a j-th shift register unit in an [M+(N−2)/2]-th shift register; and a pull-up reset signal terminal of a j-th shift register unit in an L-th shift register is connected to a signal output terminal of a j-th shift register unit in an (L+N/2)-th shift register; where M takes 1 to p−(N−2)/2; L takes 1 to p−N/2; and j takes 1 to q.

In some embodiments, the display panel further includes N redundant shift registers, and the N redundant shift registers are connected to the N clock signal lines, respectively; each redundant shift register includes q redundant shift register units; each redundant shift register unit has the same structure as each shift register unit; wherein signal output terminals of j-th redundant shift register units in first to (N/2)-th redundant shift registers are connected to pull-up reset signal terminals of j-th shift register units in (p−N/2+1)-th to p-th shift registers, respectively; and signal output terminals of j-th redundant shift register units in (N/2+1)-th to N-th redundant shift registers are connected to pull-up reset signal terminals of the j-th redundant shift register units in the first to (N/2)-th redundant shift registers, respectively.

In some embodiments, in a case where a duty ratio of the clock signal is 50%, and N is an even number greater than or equal to 4;

a signal input terminal of each shift register unit in first to N/2 shift registers responds to a frame start signal;

a signal output terminal of a j-th shift register unit in an M-th shift register is connected to a signal input terminal of a j-th shift register unit in an (M+N/2)-th shift register; and a pull-up reset signal terminal of a j-th shift register unit in an L-th shift register is connected to a signal output terminal of a j-th shift register unit in an [L+(N/2+1)]-th shift register; where M takes 1 to p−N/2; L takes 1 to p−(N/2+1); and j takes 1 to q.

In some embodiments, the display panel further includes N+2 redundant shift registers, and first to N-th redundant shift registers of the N+2 redundant shift registers are connected to the N clock signal lines, respectively, and (N+1)-th and (N+2)-th redundant shift registers of the N+2 redundant shift registers are connected to first and second clock signal lines, respectively; each redundant shift register includes q redundant shift register units; each redundant shift register unit has the same structure as each shift register unit; wherein signal output terminals of j-th redundant shift register units in first to (N/2+1)-th redundant shift registers are connected to pull-up reset signal terminals of j-th shift register units in (p−N/2)-th to p-th shift registers, respectively; and signal output terminals of j-th redundant shift register units in (N/2+2)-th to (N+2)-th redundant shift registers are connected to pull-up reset signal terminals of the j-th redundant shift register units in the first to (N/2+1)-th redundant shift registers, respectively.

In some embodiments, pixel units in a same row are connected to a same gate line; each shift register includes one (e.g., only one) shift register unit and q sub signal output terminals connected to a signal output terminal of the shift register unit, sub signal output terminals are connected to gate lines in one-to-one correspondence.

In some embodiments, each shift register unit includes at least an input sub-circuit, an output sub-circuit, and a pull-up reset sub-circuit; wherein the input sub-circuit inputs, in response to an input signal input from a signal input terminal, the input signal to a pull-up node; the output sub-circuit inputs a clock signal input through a corresponding clock signal line to a signal output terminal in response to a potential of the pull-up node, so that the signal output terminal outputs the clock signal through the q sub signal output terminals; the pull-up reset sub-circuit resets the potential of the pull-up node through a turn-off level signal in response to a pull-up reset signal input from a pull-up reset signal terminal; and every adjacent N shift register units are connected to the N clock signal lines in one-to-one correspondence, and an i-th shift register unit and an (i+N)-th shift register unit are connected to a same clock signal line, where i takes 1 to p−N.

In some embodiments, in a case where a duty ratio of the clock signal is 30%, and N is an even number greater than or equal to 6, signal input terminals of first to (N−4)/2 shift register units respond to a frame start signal;

a signal output terminal of an M-th shift register unit is connected to a signal input terminal of an [M+(N−4)/2]-th shift register unit; and a pull-up reset signal terminal of an L-th shift register unit is connected to a signal output terminal of an [L+(N/2−1)]-th shift register unit; where M takes 1 to p−(N−4)/2; and L takes 1 to p−(N/2−1).

In some embodiments, the display panel further includes N−2 redundant shift registers, the N−2 redundant shift registers are connected to N−2 clock signal lines, respectively, and each redundant shift register includes one (e.g., only one) redundant shift register unit; the redundant shift register unit has the same structure as the shift register unit; wherein signal output terminals of first to (N/2−1)-th redundant shift register units are connected to pull-up reset signal terminals of [p−(N/2−2)]-th to p-th shift register units, respectively; and signal output terminals of N/2-th to (N−2)-th redundant shift register units are connected to pull-up reset signal terminals of the first to (N/2−1)-th redundant shift register units, respectively.

In some embodiments, in a case where a duty ratio of the clock signal is 40%, and N is an even number greater than or equal to 4;

signal input terminals of first to (N−2)/2 shift register units responds to a frame start signal;

a signal output terminal of an M-th shift register unit is connected to a signal input terminal of an [M+(N−2)/2]-th shift register unit; and a pull-up reset signal terminal of an L-th shift register unit is connected to a signal output terminal of an (L+N/2)-th shift register unit; where M takes 1 to p−(N−2)/2; and L takes 1 to p−N/2.

In some embodiments, the display panel further includes N redundant shift registers, and the N redundant shift registers are connected to the N clock signal lines, respectively; each redundant shift register includes one (e.g., only one) redundant shift register units; each redundant shift register unit has the same structure as each shift register unit; wherein signal output terminals of first to (N/2)-th redundant shift register units are connected to pull-up reset signal terminals of (p−N/2+1)-th to p-th shift register units, respectively; and signal output terminals of (N/2+1)-th to N-th redundant shift register units are connected to pull-up reset signal terminals of the first to (N/2)-th redundant shift register units, respectively.

In some embodiments, in a case where a duty ratio of the clock signal is 50%, and N is an even number greater than or equal to 4;

signal input terminals of first to N/2 shift register units responds to a frame start signal;

a signal output terminal of an M-th shift register unit is connected to a signal input terminal of an (M+N/2)-th shift register unit; and a pull-up reset signal terminal of an L-th shift register unit is connected to a signal output terminal of an [L+(N/

2+1)]-th shift register unit; where M takes 1 to p−N/2; and L takes 1 to p−(N/2+1).

In some embodiments, the display panel further includes N+2 redundant shift registers, and first to N-th redundant shift registers of the N+2 redundant shift registers are connected to the N clock signal lines, respectively, and (N+1)-th and (N+2)-th redundant shift registers of the N+2 redundant shift registers are connected to first and second clock signal lines, respectively; each redundant shift register includes one (e.g., only one) redundant shift register unit; each redundant shift register unit has the same structure as each shift register unit; wherein signal output terminals of first to (N/2+1)-th redundant shift register units are connected to pull-up reset signal terminals of (p−N/2)-th to p-th shift register units, respectively; and signal output terminals of (N/2+2)-th to (N+2)-th redundant shift register units are connected to pull-up reset signal terminals of the first to (N/2+1)-th redundant shift register units, respectively.

In some embodiments, the q rows of pixel units in each group are adjacent to each other.

In a second aspect, an embodiment of the present disclosure provides a display device including the display panel as described above.

DETAIL DESCRIPTION OF EMBODIMENTS

Figure 1:
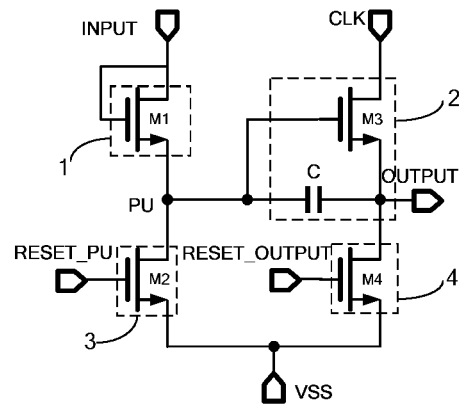
FIG. 1 is a circuit diagram of a shift register unit.

In order to enable one of ordinary skill in the art to better understand the technical solutions of the present disclosure, the present disclosure will be further described in detail below with reference to the accompanying drawings and specific implementations.

Unless otherwise defined, technical terms or scientific terms used herein should have general meanings that can be understood by one of ordinary skill in the technical field to which the present disclosure belongs. The words "first", "second" and the like used herein do not denote any order, quantity, or importance, but are just used to distinguish between different elements from each other. Similarly, the words "an", "a", "the" and the like are not used to limit the quantity, but denote the presence of at least one element. The words "include", "comprise" and the like indicate that an element or object before the words covers the elements or objects listed after the words or the equivalents thereof, rather than excluding other elements or objects. The words "connect", "couple" and the like are not restricted to physical or mechanical connection, but may also include electrical connection, whether direct or indirect connection. The words "on", "under", "left", "right" and the like are only used to indicate relative positional relationships, and when an absolute position of an object described is changed, the relative positional relationships may also be changed accordingly.

It should be noted that transistors used in the embodiments of the present disclosure may be thin film transistors, field effect transistors, or other devices having the same characteristics. Since a source electrode and a drain electrode of each of the transistors used are symmetrical, there is no difference between the source electrode and the drain electrode. In the embodiments of the present disclosure, in order to distinguish between the source electrode and the drain electrode of each transistor, one of the source electrode and the drain electrode is referred to as a first electrode, and the other thereof is referred to as a second electrode. Further, a gate electrode of the transistor is referred to as a control electrode. In addition, the transistors can be classified as N-type transistors and P-type transistors according to their characteristics. The N-type transistors are taken as an example in the following description of the embodiments. In a case where an N-type transistor is used, a first electrode is a source electrode of the N-type transistor, a second electrode is a drain electrode of the N-type transistor, and the source electrode and the drain electrode are electrically connected to each other when a high level is input to a gate electrode of the N-type transistor. The conditions of a P-type transistor are contrary to those of the N-type transistor. It can be readily envisaged by one of ordinary skill in the art without creative efforts to use the P-type transistors instead of the N-type transistors, and therefore, the use of the P-type transistors also falls within the scope of the embodiments of the present disclosure.

Since the transistors used in the embodiments of the present disclosure are the N-type transistors, a turn-on level signal refers to a high level signal and a turn-off level signal refers to a low level signal in the embodiments of the present disclosure. Correspondingly, a turn-on level terminal is a high level signal terminal, and a turn-off level terminal is a low level signal terminal.

In general, a display panel includes a plurality of gate lines and a plurality of data lines, and the plurality of gate lines and the plurality of data lines cross each other to define a plurality of pixel regions, each of which is provided with a pixel unit. A structure of the display panel will be described by taking a case where an extending direction of each gate line is a row direction and an extending direction of each data line is a column direction as an example. When the display panel is driven to perform display, gate scan signals can be written to the gate lines row by row and data voltage signals can be respectively written to the data lines while scanning each gate line, according to an image to be displayed, so that pixel units in the display panel can be lit row by row.

The gate scan signals are provided by a gate driver circuit, and the data voltage signals are provided by a source driver circuit. In the related art, the gate driver circuit may be integrated in a gate driver chip, and the source driver circuit may be integrated in a source driver chip. In order to reduce the number of chips and realize narrow bezel or no bezel, the GOA technology for integrating a gate driver circuit on an array substrate is provided currently. In the GOA technology, the gate driver circuit includes a plurality of shift register units cascaded and integrated on the array substrate, and the plurality of shift register units are connected to the plurality of gate lines in one-to-one correspondence, so that each shift register unit provides a gate scan signal to the gate line connected thereto.

In order to make a manner in which the shift register units realize output of the gate scan signals clearer, a description is given below in conjunction with specific implementations of the shift register units.

In an exemplary embodiment, as shown in a circuit diagram of a shift register unit in FIG. 1, the shift register unit includes an input sub-circuit 1, an output sub-circuit 2, a pull-up reset sub-circuit 3 and an output reset sub-circuit 4. The input sub-circuit 1 charges, in response to an input signal input by a signal input terminal INPUT, a pull-up node PU through the input signal. The output sub-circuit 2 outputs a clock signal input by a clock signal terminal CLK through a signal output terminal OUTPUT in response to a potential of the pull-up node PU. The pull-up reset sub-circuit 3 resets the pull-up node PU through a low level signal in response to a pull-up reset signal output by a pull-up reset signal terminal RESET_PU. The output reset sub-circuit 4 resets the signal output terminal OUTPUT through a low level signal in response to an output reset signal.

Specifically, as shown in FIG. 1, the input sub-circuit 1 includes a first transistor M1. The pull-up reset sub-circuit 3 includes a second transistor M2. The output sub-circuit 2 includes a third transistor M3 and a storage capacitor C. The output reset sub-circuit 4 includes a fourth transistor M4. A gate electrode and a source electrode of the first transistor M1 are connected to the signal input terminal INPUT, and a drain electrode of the first transistor M1 is connected to the pull-up node PU. A gate electrode of the second transistor M2 is connected to the pull-up reset signal terminal RESET_PU, a source electrode of the second transistor M2 is connected to the pull-up node PU, and a drain electrode of the second transistor M2 is connected to a low level signal terminal VSS. A gate electrode of the third transistor M3 is connected to the pull-up node PU, a source electrode of the third transistor M3 is connected to the clock signal terminal, and a drain electrode of the third transistor M3 is connected to the signal output terminal OUTPUT. A first terminal of the storage capacitor C is connected to the pull-up node PU, and a second terminal of the storage capacitor C is connected to the signal output terminal OUTPUT. A gate electrode of the fourth transistor M4 is connected to an output reset signal terminal RESET_OUTPUT, a source electrode of the fourth transistor M4 is connected to the signal output terminal OUTPUT, and a drain electrode of the fourth transistor M4 is connected to the low level signal terminal.

In an input stage, a high level signal is written to the signal input terminal INPUT (i.e., the signal input terminal INPUT supplies a high level signal), the first transistor M1 is turned on, the pull-up node PU is pulled up through the high level signal, and the storage capacitor C is charged.

In an output stage, since the pull-up node PU is pulled up in the input stage, the third transistor M3 is turned on, and a high level signal input from the clock signal terminal is output to the gate line connected to the shift register unit through the signal output terminal OUTPUT.

In a reset stage, a high level signal is input from the output reset signal terminal RESET_OUTPUT, the fourth transistor M4 is turned on, and an output of the signal output terminal OUTPUT is pulled down through a low level signal input from the low level signal terminal; and a high level signal is input from the pull-up reset signal terminal RESET_PU, the second transistor M2 is turned on, the potential of the pull-up node PU is pulled down through the low level signal input from the low level signal terminal. Thus, resetting of the pull-up node PU and resetting of the signal output terminal OUTPUT are completed.

It should be noted that the output reset sub-circuit 4 may be omitted from the shift register unit. In this case, after the pull-up node PU is reset in the reset stage, the pull-up node PU is at a low level, at this time, the third transistor M3 is turned off, and the signal output terminal OUTPUT stops outputting, so that the resetting of the signal output terminal OUTPUT is completed.

Figure 2:
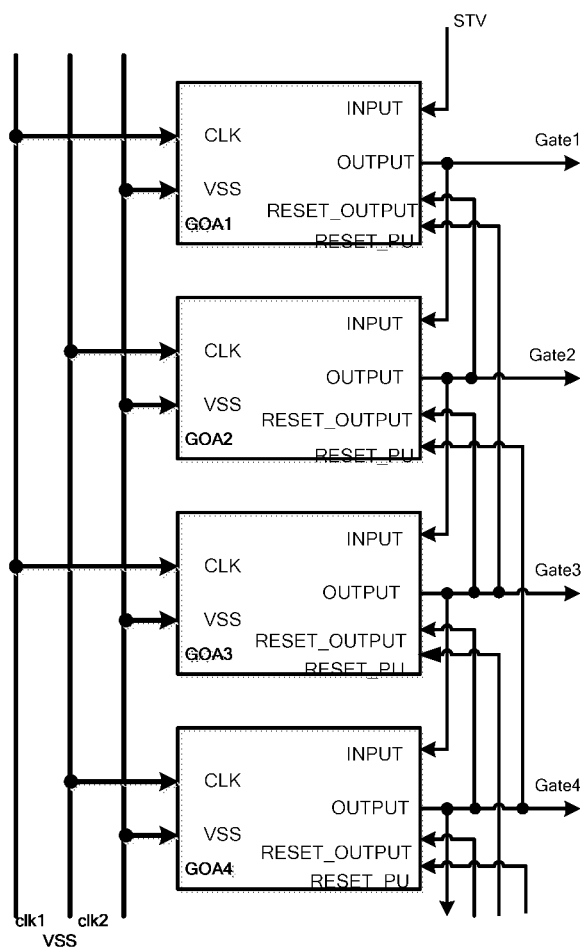
FIG. 2 is a schematic diagram of a cascade of a gate drive circuit.

In addition, for the gate driver circuit adopting the above shift register unit, as shown in FIG. 2, a cascade relation of a first to a fourth shift register units (GOA1 to GOA 4) is taken as an example. The signal output terminal OUTPUT of a shift register unit in a current stage is connected to the pull-up reset signal terminal RESET_PU of a shift register unit in a previous stage, and the signal input terminal INPUT of a shift register unit in a next stage.

Figure 3:
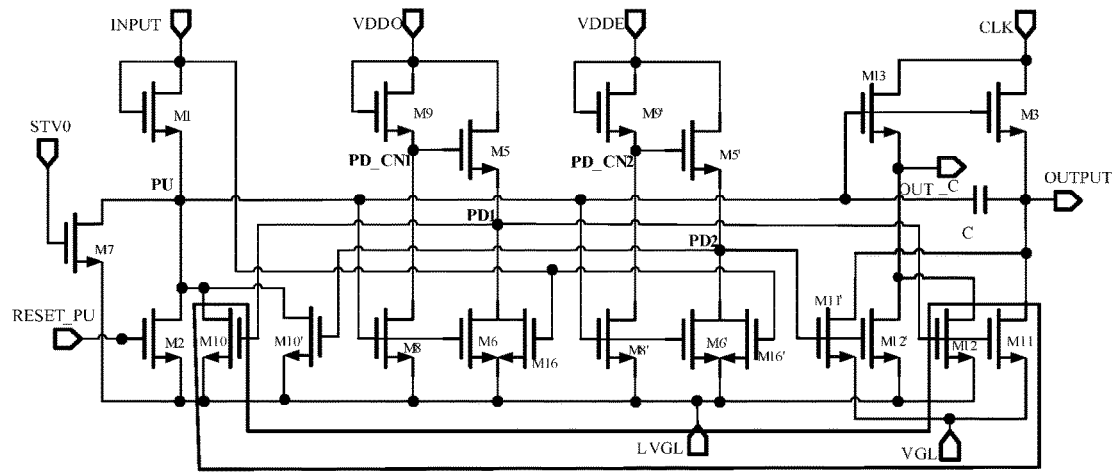
FIG. 3 is a circuit diagram of another shift register unit.

In another exemplary embodiment, as shown in FIG. 3, in order to optimize the shift register unit, there is further provided another shift register unit, which not only includes the input sub-circuit 1, the output sub-circuit 2 and the pull-up reset sub-circuit 3 described above, but also includes a first pull-down control sub-circuit, a second pull-down control sub-circuit, a first pull-down sub-circuit, a second pull-down sub-circuit, a first noise reduction sub-circuit, a second noise-reduction sub-circuit, a cascade sub-circuit, a discharge sub-circuit, a first auxiliary sub-circuit, and a second auxiliary sub-circuit. The discharge sub-circuit discharges the pull-up node PU through a low level input from the low level signal terminal in response to a pre-frame start signal input from a pre-frame start signal terminal STV0. The first pull-down control sub-circuit and the second pull-down control sub-circuit have the same structure and the same function as each other, and just operate in a time-division manner. Similarly, the first pull-down sub-circuit and the second pull-down sub-circuit have the same structure and the same function as each other; the first auxiliary sub-circuit and the second auxiliary sub-circuit have the same structure and the same function; and the first noise reduction sub-circuit and the second noise reduction sub-circuit have the same structure and the same function. The structures and functions of the input sub-circuit 1, the output sub-circuit 2 and the pull-up reset sub-circuit 3 are the same as those described above, and thus are not repeated here. The first auxiliary sub-circuit and the second auxiliary sub-circuit respectively pull down a first pull-down node PD1 and a second pull-down node PD2 through low level signals in response to input signals input from the signal input terminal INPUT. The first pull-down control sub-circuit controls a potential of the first pull-down node PD1 in response to a first power supply voltage input from a first power supply voltage signal terminal VDDO. The second pull-down control sub-circuit controls a potential of the second pull-down node PD2 in response to a second power supply voltage input from a second power supply voltage signal terminal VDDE. The first pull-down sub-circuit pulls down the first pull-down node PD1 and a first pull-down control node PD_CN1 through a level signal input from a low level signal terminal LVGL in response to the pull-up node PU. The second pull-down sub-circuit pulls down the second pull-down node PD2 and a second pull-down control node PD_CN2 through a level signal input by the low level signal terminal LVGL in response to the pull-up node PU. The first noise reduction sub-circuit performs noise reduction on signals output from the pull-up node PU, a cascade signal output terminal OUT_C and the signal output terminal OUTPUT through a level signal input from the low level signal terminal LVGL or VGL in response to the potential of the first pull-down node PD1. The cascade sub-circuit outputs a clock signal input from the clock signal terminal through the cascade signal output terminal OUT_C in response to the potential of the pull-up node PU.

It should be noted here that a signal output by the cascade signal output terminal OUT_C and a signal output by the signal output terminal OUTPUT are the same as each other, and the only difference between the two output terminals provided in the shift register unit is that the signal output terminal OUTPUT is connected to a gate line and the cascade signal output terminal OUT_C is configured for cascading. The cascade sub-circuit is separately provided to reduce a load of the signal output terminal OUTPUT, so as not to affect the gate scan signals output by the signal output terminal OUTPUT.

In addition, for the gate driver circuit adopting the above shift register unit, as shown in FIG. 2, the cascade signal output terminal OUT_C of a shift register unit in a current stage is connected to the pull-up reset signal terminal RESET_PU of a shift register unit in a previous stage and the signal input terminal INPUT of a shift register unit in a next stage. Alternatively, it should be understood that each shift register unit above may not be provided with the cascade sub-circuit, in this case, the signal output terminal OUTPUT of the shift register unit in the current stage is connected to the pull-up reset signal terminal RESET_PU of the shift register in the previous stage and the signal input terminal INPUT of the shift register unit in the next stage.

Specifically, as shown in FIG. 3, each of the first pull-down control sub-circuit and the second pull-down control sub-circuit includes a fifth transistor and a ninth transistor. The fifth transistors in the first pull-down control sub-circuit and the second control sub-circuit are denoted by M5 and M5', respectively, and the ninth transistors in the first pull-down control sub-circuit and the second control sub-circuit are denoted by M9 and M9', respectively. Each of the first pull-down sub-circuit and the second pull-down sub-circuit includes a sixth transistor and an eighth transistor. The sixth transistors in the first pull-down sub-circuit and the second pull-down sub-circuit are denoted by M6 and M6', respectively, and the eighth transistors in the first pull-down sub-circuit and the second pull-down sub-circuit are denoted by M8 and M8', respectively. Each of the first noise reduction sub-circuit and the second noise reduction sub-circuit includes a tenth transistor, an eleventh transistor, and a twelfth transistor. The tenth transistors in the first noise reduction sub-circuit and the second noise reduction sub-circuit are denoted by M10 and M10', respectively. The eleventh transistors in the first noise reduction sub-circuit and the second noise reduction sub-circuit are denoted by M11 and M11', respectively; and the twelfth transistors in the first noise reduction sub-circuit and the second noise reduction sub-circuit are denoted by M12 and M12', respectively. The discharge sub-circuit includes a seventh transistor M7. The cascade sub-circuit includes a thirteenth transistor M13. Each of the first auxiliary sub-circuit and the second auxiliary sub-circuit includes a sixteenth transistor, and the sixteenth transistors in the first auxiliary sub-circuit and the second auxiliary sub-circuit are denoted by M16 and M16', respectively.

With continued reference to FIG. 3, the gate electrode and the source electrode of the first transistor M1 are connected to the signal input terminal INPUT, and the drain electrode of the first transistor M1 is connected to the pull-up node PU. The gate electrode of the second transistor M2 is connected to the pull-up reset signal terminal RESET_PU, the source electrode of the second transistor M2 is connected to the pull-up node PU, and the drain electrode of the second transistor M2 is connected to the low level signal terminal LVGL. The gate electrode of the third transistor M3 is connected to the pull-up node PU, the source electrode of the third transistor M3 is connected to the clock signal terminal, and the drain electrode of the third transistor M3 is connected to the signal output terminal OUTPUT. The first terminal of the storage capacitor C is connected to the pull-up node PU, and the second terminal of the storage capacitor C is connected to the signal output terminal OUTPUT. A gate electrode and a source electrode of the ninth transistor M9 are both connected to the first power supply voltage terminal VDDO, and a drain electrode of the ninth transistor M9 is connected to the first pull-down control node PD_CN1. A gate electrode of the fifth transistor M5 is connected to the first pull-down control node PD_CN1, a source electrode of the fifth transistor M5 is connected to the first power supply voltage terminal, and a drain electrode of the fifth transistor M5 is connected to the first pull-down node PD1. A gate electrode and a source electrode of the ninth transistor M9' are both connected to the second power supply voltage terminal VDDE, and a drain electrode of the ninth transistor M9' is connected to the second pull-down control node PD_CN2. A gate electrode of the fifth transistor M5' is connected to the second pull-down control node PD_CN2, a source electrode of the fifth transistor M5' is connected to the second power supply voltage terminal, and a drain electrode of the fifth transistor M5' is connected to the second pull-down node PD2. A gate electrode of the sixth transistor M6 is connected to the pull-up node PU, a source electrode of the sixth transistor M6 is connected to the first pull-down node PD1, and a drain electrode of the sixth transistor M6 is connected to the low level signal terminal LVGL. A gate electrode of the eighth transistor M8 is connected to the pull-up node PU, a source electrode of the eighth transistor M8 is connected to the first pull-down control node PD_CN1, and a drain electrode of the eighth transistor M8 is connected to the low level signal terminal. A gate electrode of the sixth transistor M6' is connected to the pull-up node PU, a source electrode of the sixth transistor M6' is connected to the second pull-down node PD2, and a drain electrode of the sixth transistor M6' is connected to the low level signal terminal. A gate electrode of the eighth transistor M8' is connected to the pull-up node PU, a source electrode of the eighth transistor M8' is connected to the second pull-down control node PD_CN2, and a drain electrode of the eighth transistor M8' is connected to the low level signal terminal. A gate electrode of the tenth transistor M10 is connected to the first pull-down node PD1, a source electrode of the tenth transistor M10 is connected to the pull-up node PU, and a drain electrode of the tenth transistor M10 is connected to the low level signal terminal. A gate electrode of the eleventh transistor M11 is connected to the first pull-down node PD1, a source electrode of the eleventh transistor M11 is connected to the signal output terminal OUTPUT, and a drain electrode of the eleventh transistor M11 is connected to the low level signal terminal VGL. A gate electrode of the twelfth transistor M12 is connected to the first pull-down node PD1, a source electrode of the twelfth transistor M12 is connected to the cascade signal output terminal OUT_C, and a drain electrode of the twelfth transistor M12 is connected to the low level signal terminal. A gate electrode of the tenth transistor M10' is connected to the second pull-down node PD2, a source electrode of the tenth transistor M10' is connected to the pull-up node PU, and a drain electrode of the tenth transistor M10' is connected to the low level signal terminal. A gate electrode of the eleventh transistor M11' is connected to the second pull-down node PD2, a source electrode of the eleventh transistor M11' is connected to the signal output terminal OUTPUT, and a drain electrode of the eleventh transistor M11' is connected to the low level signal terminal. A gate electrode of the twelfth transistor M12' is connected to the second pull-down node PD2, a source electrode of the twelfth transistor M12' is connected to the cascade signal output terminal OUT_C, and a drain electrode of the twelfth transistor M12' is connected to the low level signal terminal. A gate electrode of the seventh transistor M7 is connected to the pre-frame start signal terminal, a source electrode of the seventh transistor M7 is connected to the pull-up node PU, and a drain electrode of the seventh transistor M7 is connected to the low level signal terminal. A gate electrode of the thirteenth transistor M13 is connected to the pull-up node PU, a source electrode of the thirteenth transistor M13 is connected to the clock signal terminal, and a drain electrode of the thirteenth transistor M13 is connected to the cascade signal output terminal OUT_C. A gate electrode of the sixteenth transistor M16 is connected to the signal input terminal INPUT, a source electrode of the sixteenth transistor M16 is connected to the first pull-down node PD1, and a drain electrode of the sixteenth transistor M16 is connected to the low level signal terminal. A gate electrode of the sixteenth transistor M16' is connected to the signal input terminal INPUT, a source electrode of the sixteenth transistor M16' is connected to the second pull-down node PD2, and a drain electrode of the sixteenth transistor M16' is connected to the low level signal terminal.

The first pull-down control sub-circuit formed by the fifth transistor M5 and the ninth transistor M9, and the second pull-down control sub-circuit formed by the fifth transistor M5' and the ninth transistor M9' operate in a time-division manner (that is, operate in turn). Correspondingly, since the first noise reduction sub-circuit formed by the tenth transistor M10, the eleventh transistor M11 and the twelfth transistor M12 and the second noise reduction sub-circuit formed by the tenth transistor M10', the eleventh transistor M11' and the twelfth transistor M12' are controlled by the first pull-down control sub-circuit and the second pull-down control sub-circuit, respectively, the first noise reduction sub-circuit and the second noise reduction sub-circuit also operate in a time-division manner. An operating principle of the first pull-down control sub-circuit is the same as that of the second pull-down control sub-circuit, and an operating principle of the first noise reduction sub-circuit is the same as that of the second noise reduction sub-circuit. Therefore, an operating principle of the shift register unit when the first pull-down control sub-circuit and the first noise reduction sub-circuit are operating will be described below.

In a discharging stage, before a frame, that is, before display is performed, a high level signal is firstly input to the pre-frame start signal terminal, and the pull-up node PU is discharged through a low level signal input from the low level signal terminal, so as to prevent abnormal display caused by residual charges at the pull-up node PU.

In the input stage, a high level signal is input from the signal input terminal INPUT, the first transistor M1 is turned on, the pull-up node PU is pulled up through the high level signal, the storage capacitor C is charged, in the meanwhile, both the sixteenth transistors M16 and M16' are turned on, and the first pull-down node PD1 and the second pull-down node PD2 are pulled down, so as not to affect a potential of the pull-up node PU.

In the output stage, since the pull-up node PU is pulled up in the input stage, the third transistor M3 and the thirteenth transistor M13 are turned on, a high level signal input from the clock signal terminal is output to the gate line connected to the shift register unit through the signal output terminal OUTPUT, and in the meanwhile, the cascade signal output terminal OUT_C outputs the same signal as the signal output terminal OUTPUT, that is, outputs the high level signal to the pull-up reset signal terminal RESET_PU of the shift register in the previous stage and the signal input terminal INPUT of the shift register unit in the next stage.

In the reset stage, a high level signal is input from the pull-up reset signal terminal RESET_PU, the second transistor M2 is turned on, the potential of the pull-up node PU is pulled down through a low level signal input from the low level signal terminal to reset the pull-up node PU; and since the pull-up node PU is pulled down, the third transistor M3 and the thirteenth transistor M13 are turned off, and both the signal output terminal OUTPUT and the cascade signal output terminal OUT_C no longer output the high level signal. Meanwhile, the first pull-down control node PD_CN1 and the first pull-down node PD1 are both provided with high level signals, and the tenth transistor M10, the eleventh transistor M11 and the twelfth transistor M12 are turned on to respectively denoise outputs of the pull-up node PU, the signal output terminal OUTPUT and the cascade signal output terminal OUT_C, until the potential of the pull-up node PU is pulled up when scanning of a next frame is started.

As shown in FIG. 3, it can be seen that, in order to reduce the load of the signal output terminal OUTPUT, the signal output by the signal output terminal OUTPUT is only configured to control turn-on and turn-off of the gate line, and the cascade signal output terminal OUT_C is only configured for cascading between the shift register unit in the current stage and the shift registers in the previous stage and in the next stage. However, the signal output by the signal output terminal OUTPUT and that output by the cascade signal output terminal OUT_C are synchronous, and the cascade sub-circuit may be omitted in practical applications. In such a case, the shift register unit in the current stage is cascaded with the shift register unit in the previous stage and the shift register unit in the next stage through the signal output terminal OUTPUT.

The inventors have found that in the related art, one shift register unit in the gate driver circuit only provides a gate scan signal for one gate line. As a result, with the continuous increase of a size of the display panel from 65 inches or 75 inches to 98 inches or 110 inches, a resolution of the display panel also increases continuously from FHD or UHD to 8K, and a refresh rate thereof increases from 60 HZ to 120 HZ. This makes the design of the product more difficult, especially an enough charging rate of pixels in the product cannot be guaranteed, which in turn affects display quality. Taking a product with a size of 110 inches, a resolution of 8K and a refresh rate of 120 HZ as an example, charging time for each row of pixels is only 1.85 us, and the charging time and the charging rate of the product cannot meet design requirements. Moreover, for a product with a too large size, display of a remote signal also has serious delay, and a risk of crosstalk between rows is high.

In view of the above problems, the following technical solutions are provided in the embodiments of the present disclosure.

Figure 4:
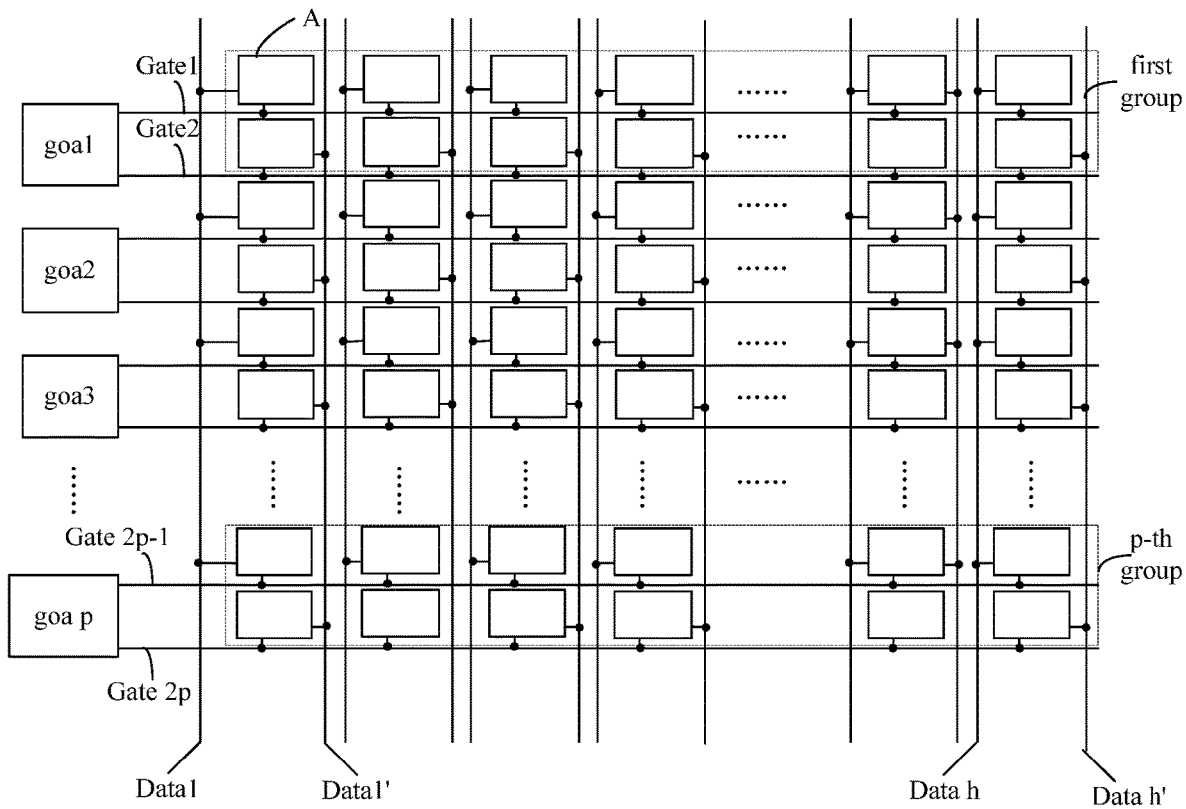
FIG. 4 is a schematic structural diagram of a display panel according to an embodiment of the present disclosure.

In a first aspect, as shown in FIG. 4, an embodiment of the present disclosure provides a display panel, which includes p pixel unit groups (i.e., p groups of pixel units), and each of the p pixel unit groups includes q rows of pixel units (i.e., q pixel unit rows), where both p and q are integers greater than or equal to 2. Pixel units in a same group are supplied with a gate scan signal simultaneously by a same shift register; pixel units in a same group and in a same column are supplied with data voltage signals through different data lines.

It should be noted here that, as shown in FIG. 4, the display panel includes p pixel unit groups, accordingly, the display panel includes p shift registers and 2p gate lines. In a case where there are h columns of pixel units, 2h data lines are included.

In the embodiment of the present disclosure, one pixel unit group is supplied with a gate scan signal by the same shift register, and the pixel units in the same group and in the same column are supplied with data voltage signals through different data lines, in this way, multiple rows of pixel units can display at the same time when the display panel is controlled to display, so that a refresh frequency can be effectively increased, thereby avoiding the problem of insufficient charging time and/or insufficient charging rate of the display panel (especially a large-size display panel).

It should be noted here that multiple rows of pixel units are scanned at the same time, but data voltage signals required by the pixel units that are scanned at the same time and located in the same column may be different according to display contents, and therefore, it is necessary to increase the number of data lines to meet the demand of each pixel unit on the data voltage signal. For example, each pixel unit group includes two rows of pixel units, and in this case, at least two data lines are needed to provide data voltage signals for each column of pixel units. Certainly, in order to avoid too large increase in the number of the data lines to affect wiring and transmittance of the display panel, each shift register should not provide gate scan signals for too many rows of pixel units.

In some embodiments, q=2, that is, each pixel unit group includes two rows of pixel units, and each shift register simultaneously provides a gate scan signal for two rows of pixel units in one pixel unit group; and pixel units in different groups are supplied with gate scan signals by different shift registers. Two pixel units in a same group and in a same column are supplied with data voltage signals through two data lines. Certainly, since all pixel unit groups are scanned according to a scanning order (e.g., from top to bottom or from bottom to top), when each group includes two rows of pixel units, each column of pixel units may be supplied with data voltages through two data lines. For example, two rows of pixel units in each group are arranged adjacent to each other. In this case, in a same group, a first pixel unit in each column may be connected to one data line, and a second pixel unit in the column may be connected to the other data line. Certainly, this connection manner does not limit the protection scope of the embodiment, as long as the data lines connected to the two pixel units in the same group and in the same column are different. In addition, the two rows of pixel units in each group may be not adjacent to each other, for example, pixel units in a first row and a third row are included in one group.

In order to make the structure of the display panel in the embodiment of the present disclosure clearer, description will be given by taking a case where every two rows of pixel units are included in one group, and each column of pixel units is supplied with data voltages through two data lines as an example.

In some embodiments, the display panel includes not only the above structures but also N clock signal lines, where N is an even number greater than or equal to 4, and the number p of the pixel unit groups is greater than or equal to 2N. According to the scanning order, every N adjacent shift registers are connected to the N clock signal lines in one-to-one correspondence, and an i-th shift register and an (i+N)-th shift register are connected to a same clock signal line, where i takes (or is or ranges from) 1 to p−N. Specifically, each clock signal line is configured to provide a clock signal to the clock signal terminal of each shift register connected thereto. The display panel according to the embodiments of the present disclosure will be further described below in conjunction with two different shift register structures.

In an exemplary embodiment, the number of shift register units included in each shift register is the same as the number of rows of pixel units in each group. That is, each group includes two rows of pixel units, each shift register includes two shift register units, and since the gate scan signals output by the two shift register units are the same, the two shift register units may have a same structure. Each shift register unit may adopt any one of the shift register units shown in FIG. 1 and FIG. 3. The two shift register units in each shift register are connected to a same clock signal line. A connection manner between shift register units in each shift register and the clock signal lines will be described below by taking a case where the display panel has a size of 110 inches, adopts the 21T1C shift register unit shown in FIG. 3 and includes 10 clock signal lines as an example.

Figure 5:
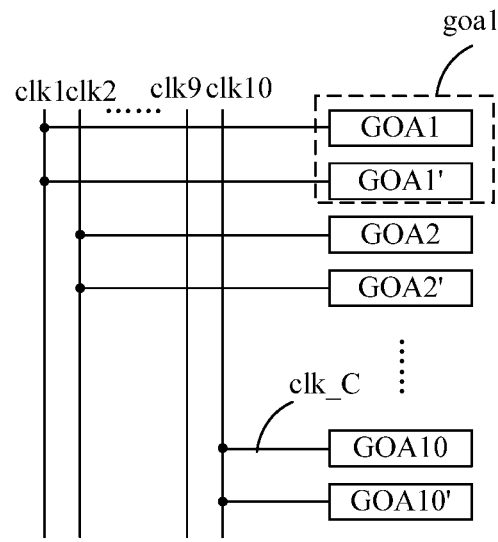
FIG. 5 is a schematic diagram illustrating a connection between shift registers and clock signal lines according to an embodiment of the present disclosure.

As a first connection manner, the 10 clock signal lines are respectively represented by first to tenth clock signal lines clk1, clk2, . . . , and clk10. In FIG. 5, every 10 shift registers are respectively connected to the 10 clock signal lines clk1, clk2, . . . , and clk10 from top to bottom. A case where a first shift register goal is connected with the first clock signal line clk1 is taken as an example. The first shift register goal includes two shift register units denoted by GOA1 and GOA1', respectively. Each of the clock signal terminals of the shift register units GOA1 and GOA1' is connected to the first clock signal line clk1 through a signal connection line clk_C. That is to say, signal connection lines and the shift register units are in one-to-one correspondence with each other. In this way, electric currents on the clock signal lines for the two shift register units of each shift register are evenly distributed, which can effectively avoid occurrence of large currents at transfer holes connecting the signal connection lines with the respective clock signal lines, so as to avoid burn-out of the transfer holes.

Figure 6:
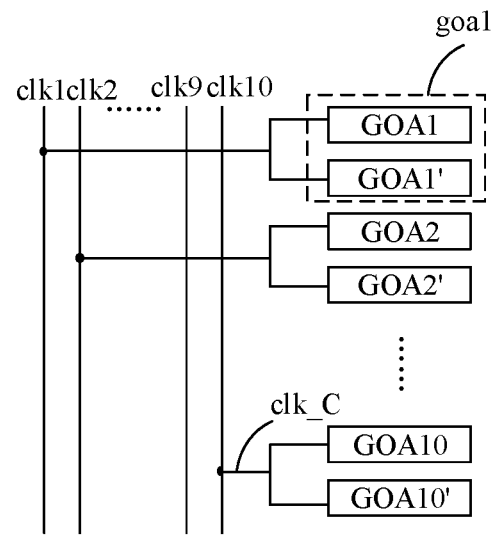
FIG. 6 is a schematic diagram illustrating another connection between shift registers and clock signal lines according to an embodiment of the present disclosure.

As a second connection manner, as shown in FIG. 6, the number of the clock signal lines in the first connection manner is also taken as an example. In this case, the first shift register goal includes two shift register units denoted by GOA1 and GOA1', respectively. The clock signal terminals of the shift register units GOA1 and GOA1' are connected to the first clock signal line clk1 through a same signal connection line clk_C. That is to say, the signal connection lines and the shift registers are in one-to-one correspondence with each other. Compared with the first connection manner, the second connection manner reduces the number of signal connection lines by half, avoids a large amount of parasitic capacitance generated by bridge connection between a large number of signal connection lines and the clock signal lines, and can effectively improve the charging rate of the display panel.

In cases where each shift register includes q shift register units, the number N of the clock signal lines is an even number greater than or equal to 4, and the duty ratio of a clock signal is 30%, 40%, and 50%, respectively, cascade relationships between shift register units will be described below. It should be noted here that, in the following description, when each shift register includes the cascade signal output terminal OUT_C, the signal output terminal OUTPUT of the shift register unit in the current stage is cascaded with a shift register unit in other stage through the cascade signal output terminal OUT_C.

In an exemplary embodiment, in a case where the number N of the clock signal lines is an even number greater than or equal to 6, and the duty ratio of the clock signal is 30%, the signal input terminal INPUT of each shift register unit in first to (N−4)/2-th shift registers responds to a frame start signal; the signal output terminal OUTPUT of a j-th shift register unit in an M-th shift register is connected to the signal input terminal INPUT of a j-th shift register unit in an [M+(N−4)/2]-th shift register; the pull-up reset signal terminal RESET_PU of a j-th shift register unit in an L-th shift register is connected to the signal output terminal OUTPUT of a j-th shift register unit in an [L+(N/2−1)]-th shift register; where M takes 1 to p−(N−4)/2; L takes 1 to p−(N/2−1); and j takes 1 to q.

In addition, since the signal output terminal OUTPUT of a p-th shift register (which is a shift register in a last stage) is connected to the pull-up reset signal terminal RESET_PU of the [p−(N/2−1)]-th shift register unit, no shift registers provide a reset signal for the pull-up node PU of each shift register unit of [p−(N/2−2)]-th to p-th shift registers. According to the above, for a reset signal for the pull-up node PU of the j-th shift register unit of the p-th shift register, the signal output terminal OUTPUT of a j-th shift register unit of a [p+(N/2−1)]-th shift register is required; at the same time, it is necessary to ensure that the j-th shift register unit of the [p+(N/2−1)]-th shift register can operate normally, and therefore N−2 shift registers need to be added. Therefore, in some embodiments, N−2 redundant shift registers are further provided in the display panel, the N−2 redundant shift registers are connected to N−2 clock signal lines, respectively, and each redundant shift register includes q redundant shift register units (which are the same as the shift register units in each shift register). The signal output terminals OUTPUT of j-th redundant shift register units in first to (N/2−1)-th redundant shift registers are respectively connected to the pull-up reset signal terminals RESET_PU of the j-th shift register units in the [p−(N/2−2)]-th to p-th shift registers; the signal output terminals OUTPUT of j-th redundant shift register units in (N/2)-th to (N−2)-th redundant shift registers are respectively connected to the pull-up reset signal terminals RESET_PU of the j-th redundant shift register units in the first to (N/2−1)-th redundant shift registers; where j takes 1 to q.

It can be seen that the [p−(N/2−2)]-th to p-th shift registers are reset through signals output by the first to (N/2−1)-th redundant shift registers; at the same time, the first to (N/2−1)-th redundant shift registers are reset through signals output by the (N/2)-th to (N−2)-th redundant shift registers, so as to ensure normal operation of the first to (N/2−1)-th redundant shift registers.

A cascade relationship of shift registers will be described below by taking a case where the number N of clock signal lines is an even number greater than or equal to 6 and the duty ratio of the clock signal is 30% as an example.

Figure 7:
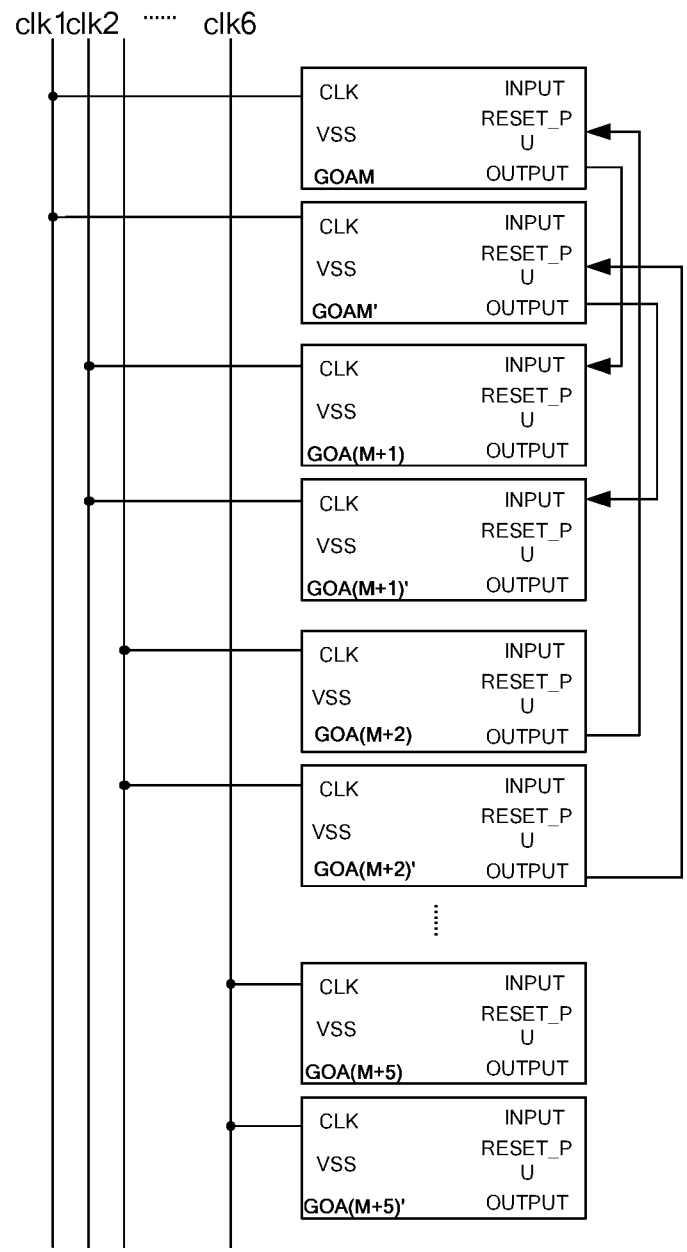
FIG. 7 is a schematic diagram of a cascade of shift registers in a case where the number of clock signal lines is 6 and a duty ratio of a clock signal is 30% according to an embodiment of the present disclosure.

For example, as shown in FIG. 7, the number N of the clock signal lines is equal to 6, and the 6 clock signal lines are first to sixth clock signal lines clk1, clk2, ..., and clk6, respectively. Each group includes two rows of pixel units, in this case, j takes 1 to 2, that is, each of the p shift registers includes two shift register units. In this case, every adjacent six shift registers are connected to the first to sixth clock signal lines clk1, clk2, ..., and clk6, respectively, and the two shift register units in each shift register are connected to a same clock signal line. Certainly, the display panel further includes 4 redundant shift registers, and each redundant shift register also includes two shift register units. First to fourth redundant shift registers of the 4 redundant shift registers are respectively connected to the first to fourth clock signal lines clk1, clk2, ..., and clk4, and the two shift register units of each redundant shift register are connected to a same clock signal line. The signal input terminals INPUT of the two shift register units in a first shift register are both connected to a frame start signal line STV (as shown in FIG. 2), that is, the two shift register units of the first shift register respond to the frame start signal. The signal output terminal OUTPUT of a first shift register unit in an M-th shift register is connected to the signal input terminal INPUT of a first shift register unit in an (M+1)-th shift register; the signal output terminal OUTPUT of a second shift register unit in the M-th shift register is connected to the signal input terminal INPUT of a second shift register unit in the (M+1)-th shift register; where M takes 1 to p−1. The pull-up reset signal terminal of a first shift register unit in an L-th shift register is connected to the signal output terminal OUTPUT of a first shift register unit in an (L+2)-th shift register; the pull-up reset signal terminal of a second shift register unit in the L-th shift register is connected to the signal output terminal OUTPUT of a second shift register unit in the (L+2)-th shift register; where L takes 1 to p−2.

In addition, the signal output terminal OUTPUT of a first shift register unit in a p-th shift register is connected to the signal input terminal INPUT of a first redundant shift register unit in the first redundant shift register; the signal output terminal OUTPUT of a second shift register unit in the p-th shift register is connected to the signal input terminal INPUT of a second redundant shift register unit in the first redundant shift register; the signal output terminal OUTPUT of a first redundant shift register unit in a K-th redundant shift register is connected to the signal input terminal INPUT of a first redundant shift register unit in a (K+1)-th redundant shift register; the signal output terminal OUTPUT of a second redundant shift register unit in the K-th redundant shift register is connected to the signal input terminal INPUT of a second redundant shift register unit in the (K+1)-th redundant shift register; where K takes 1 to 3. The signal output terminals OUTPUT of first redundant shift register units in the first and second redundant shift registers are connected to the pull-up reset signal terminals RESET_PU of first shift register units in the (p−1)-th and p-th shift registers, respectively; the signal output terminals OUTPUT of second redundant shift register units in the first and second redundant shift registers are connected to the pull-up reset signal terminals RESET_PU of second shift register units in the (p−1)-th and p-th shift registers, respectively; the signal output terminals OUTPUT of the first redundant shift register units in the third and fourth redundant shift registers are connected to the pull-up reset signal terminals RESET_PU of the first redundant shift register units in the first and second redundant shift registers, respectively; and the signal output terminals OUTPUT of the second redundant shift register units in the third and fourth redundant shift registers are connected to the pull-up reset signal terminals RESET_PU of the second redundant shift register units in the first and second redundant shift registers, respectively.

Figure 8:
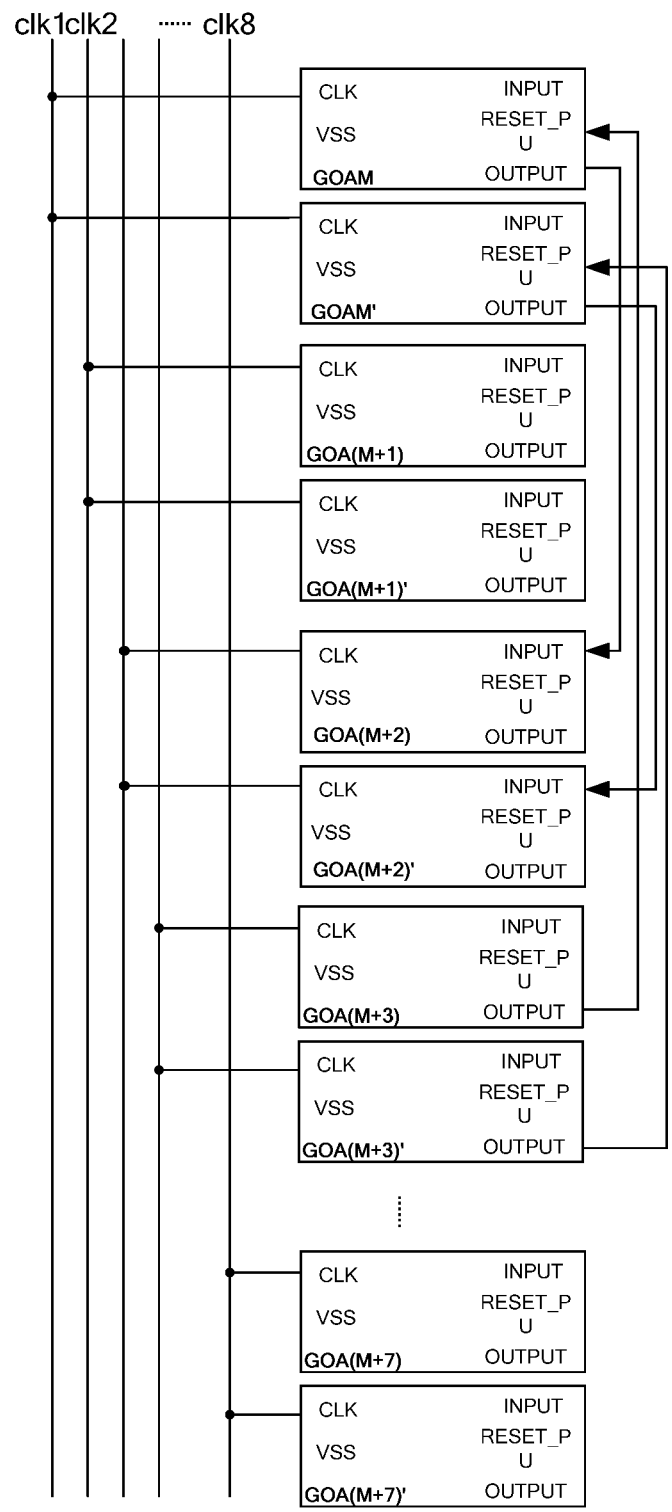
FIG. 8 is a schematic diagram of a cascade of shift registers in a case where the number of clock signal lines is 8 and a duty ratio of a clock signal is 30% according to an embodiment of the present disclosure.

For example, as shown in FIG. 8, the number N of clock signal lines is equal to 8, and the 8 clock signal lines are first to eighth clock signal lines clk1, clk2, ..., and clk8, respectively; each group includes two rows of pixel units, and in this case, j takes 1 to 2, that is, each of the p shift registers includes two shift register units. In this case, every adjacent eight shift registers are connected to the first to eighth clock signal lines clk1, clk2, ..., and clk8, respectively, and the two shift register units in each shift register are connected to a same clock signal line. Certainly, the display panel further includes 6 redundant shift registers, and each redundant shift register also includes two shift register units. The 6 redundant shift registers are respectively connected to the first to sixth clock signal lines clk1, clk2, ..., and clk6, and the two shift register units of each redundant shift register are connected to a same clock signal line. The signal input terminals INPUT of the two shift register units in each of first and second shift registers are connected to the frame start signal line, that is, the two shift register units of each of the first and second shift registers respond to the frame start signal. The signal output terminal OUTPUT of a first shift register unit in an M-th shift register is connected to the signal input terminal INPUT of a first shift register unit in an (M+2)-th shift register; the signal output terminal OUTPUT of a second shift register unit in the M-th shift register is connected to the signal input terminal INPUT of a second shift register unit in the (M+2)-th shift register; where M takes 1 to p−2. The pull-up reset signal terminal RESET_PU of a first shift register unit in an L-th shift register is connected to the signal output terminal OUTPUT of a first shift register unit in an (L+3)-th shift register; the pull-up reset signal terminal of a second shift register unit in the L-th shift register is connected to the signal output terminal OUTPUT of a second shift register unit in the (L+3)-th shift register; where L takes 1 to p−3.

In addition, the signal output terminals OUTPUT of first shift register units in (p−1)-th and p-th shift registers are connected to the signal input terminals INPUT of first redundant shift register units in the first and second redundant shift registers, respectively; the signal output terminals OUTPUT of second shift register units in the (p−1)-th and p-th shift registers are connected to the signal input terminals INPUT of second redundant shift register units in the first and second redundant shift registers, respectively; the signal output terminal OUTPUT of a first redundant shift register unit in a K-th redundant shift register is connected to the signal input terminal INPUT of a first redundant shift register unit in a (K+2)-th redundant shift register; the signal output terminal OUTPUT of a second redundant shift register unit in the K-th redundant shift register is connected to the signal input terminal INPUT of a second redundant shift register unit in the (K+2)-th redundant shift register; where K takes 1 to 4. The signal output terminals OUTPUT of first redundant shift register units in the first to third redundant shift registers are connected to the pull-up reset signal terminals RESET_PU of first shift register units in the (p−2)-th to p-th shift registers, respectively; the signal output terminals OUTPUT of second redundant shift register units in the first to third redundant shift registers are connected to the pull-up reset signal terminals RESET_PU of second shift register units in the (p−2)-th to p-th shift registers, respectively; the signal output terminals OUTPUT of first redundant shift register units in the fourth to sixth redundant shift registers are connected to the pull-up reset signal terminals RESET_PU of the first redundant shift register units in the first to third redundant shift registers, respectively; and the signal output terminals OUTPUT of the second redundant shift register units in the fourth to sixth redundant shift registers are connected to the pull-up reset signal terminals RESET_PU of the second redundant shift register units in the first to third redundant shift registers, respectively.

Figure 9:
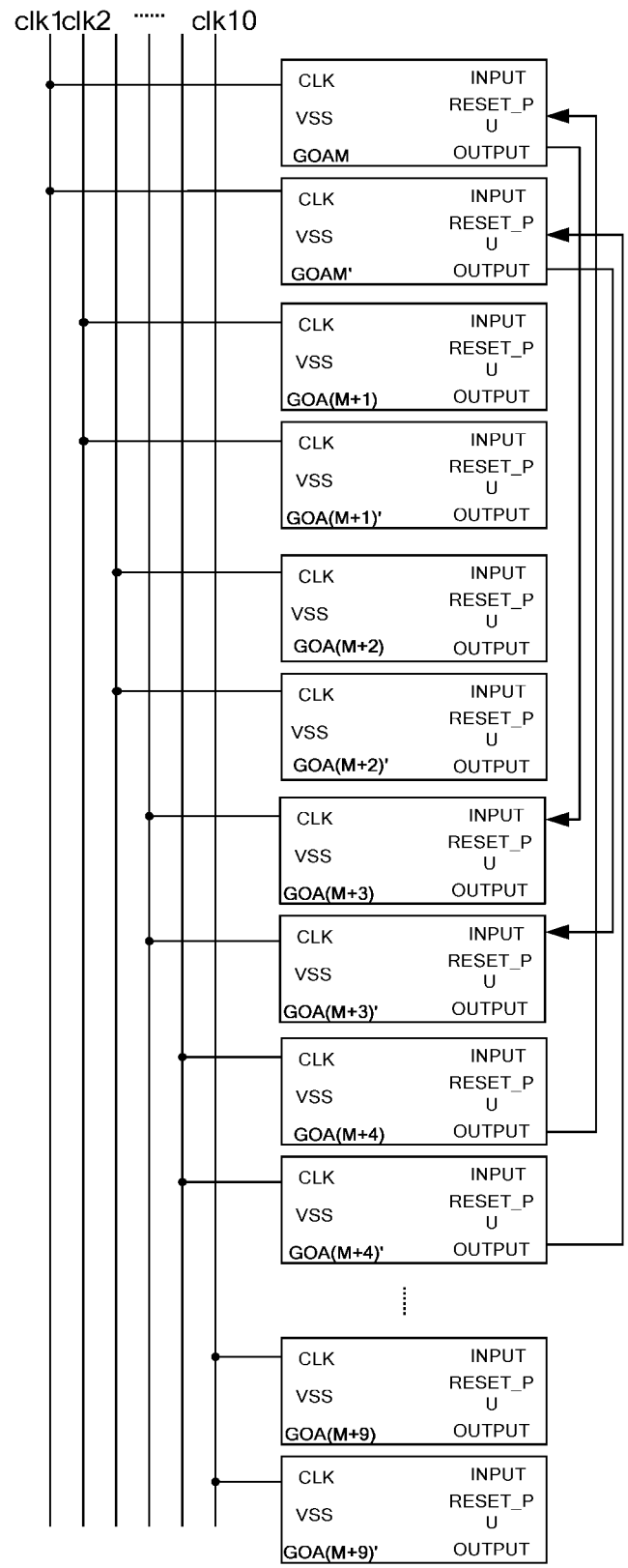
FIG. 9 is a schematic diagram of a cascade of shift registers in a case where the number of clock signal lines is 10 and a duty ratio of a clock signal is 30% according to an embodiment of the present disclosure.

For example, as shown in FIG. 9, the number N of clock signal lines is equal to 10, and the 10 clock signal lines are first to tenth clock signal lines clk1, clk2, . . . , and clk10, respectively; each group includes two rows of pixel units, and in this case, j takes 1 to 2, that is, each of the p shift registers includes two shift register units. In this case, every adjacent ten shift registers are connected to the first to tenth clock signal lines clk1, clk2, . . . , and clk10, respectively, and the two shift register units in each shift register are connected to a same clock signal line. Certainly, the display panel further includes 8 redundant shift registers, and each redundant shift register also includes two shift register units. First to eighth redundant shift registers are respectively connected to the first to eighth clock signal lines clk1, clk2, . . . , and clk8, and the two shift register units of each redundant shift register are connected to a same clock signal line. The signal input terminals INPUT of the two shift register units in each of first to third shift registers are connected to the frame start signal line, that is, the two shift register units of each of the first to third shift registers respond to the frame start signal. The signal output terminal OUTPUT of a first shift register unit in an M-th shift register is connected to the signal input terminal INPUT of a first shift register unit in an (M+3)-th shift register; and the signal output terminal OUTPUT of a second shift register unit in the M-th shift register is connected to the signal input terminal INPUT of a second shift register unit in the (M+3)-th shift register; where M takes 1 to p−3. The pull-up reset signal terminal RESET_PU of a first shift register unit in an L-th shift register is connected to the signal output terminal OUTPUT of a first shift register unit in an (L+4)-th shift register; the pull-up reset signal terminal of a second shift register unit in the L-th shift register is connected to the signal output terminal OUTPUT of a second shift register unit in the (L+4)-th shift register; where L takes 1 to p−4.

In addition, the signal output terminals OUTPUT of first shift register units in (p−2)-th to p-th shift registers are connected to the signal input terminals INPUT of first redundant shift register units in the first to third redundant shift registers, respectively; the signal output terminals OUTPUT of second shift register units in the (p−2)-th to p-th shift registers are connected to the signal input terminals INPUT of second redundant shift register units in the first to third redundant shift registers, respectively; the signal output terminal OUTPUT of a first redundant shift register unit in a K-th redundant shift register is connected to the signal input terminal INPUT of a first redundant shift register unit in a (K+3)-th redundant shift register; the signal output terminal OUTPUT of a second redundant shift register unit in the K-th redundant shift register is connected to the signal input terminal INPUT of a second redundant shift register unit in the (K+3)-th redundant shift register; where K takes 1 to 5. The signal output terminals OUTPUT of first redundant shift register units in the first to fourth redundant shift registers are connected to the pull-up reset signal terminals RESET_PU of first shift register units in the (p−3)-th to p-th shift registers, respectively; the signal output terminals OUTPUT of second redundant shift register units in the first to fourth redundant shift registers are connected to the pull-up reset signal terminals RESET_PU of second shift register units in the (p−3)-th to p-th shift registers, respectively; the signal output terminals OUTPUT of first redundant shift register units in the fifth to eighth redundant shift registers are connected to the pull-up reset signal terminals RESET_PU of the first redundant shift register units in the first to fourth redundant shift registers, respectively; and the signal output terminals OUTPUT of the second redundant shift register units in the fifth to eighth redundant shift registers are connected to the pull-up reset signal terminals RESET_PU of the second redundant shift register units in the first to fourth redundant shift registers, respectively.

In another exemplary embodiment, in a case where the number N of the clock signal lines is an even number greater than or equal to 4, and the duty ratio of the clock signal is 40%, the signal input terminal INPUT of each shift register unit in first to [(N−2)/2]-th shift registers responds to the frame start signal; the signal output terminal OUTPUT of a j-th shift register unit in an M-th shift register is connected to the signal input terminal INPUT of a j-th shift register unit in an [M+(N−2)/2]-th shift register; the pull-up reset signal terminal RESET_PU of a j-th shift register unit in an L-th shift register is connected to the signal output terminal OUTPUT of a j-th shift register unit in an (L+N/2)-th shift register; where M takes 1 to p−(N−2)/2; L takes 1 to p−N/2; and j takes 1 to q.

In addition, since the signal output terminal OUTPUT of the p-th shift register (which is the shift register in the last stage) is connected to the pull-up reset signal terminal RESET_PU of the (p−N/2)-th shift register unit, no shift registers provide a reset signal for the pull-up node UP of each shift register unit of (p−N/2+1)-th to p-th shift registers. According to the above, for a reset signal for the pull-up node PU of the j-th shift register unit of the p-th shift register, the signal output terminal OUTPUT of a j-th shift register unit of a (p+N/2)-th shift register is required; at the same time, it is necessary to ensure that the j-th shift register unit of the (p+N/2)-th shift register can operate normally, and therefore N shift registers need to be added. Therefore, in some embodiments, N redundant shift registers are further provided in the display panel, the N redundant shift registers are connected to N clock signal lines, respectively, and each redundant shift register includes q redundant shift register units (which are the same as the shift register units in each shift register). The signal output terminals OUTPUT of j-th redundant shift register units in first to (N/2)-th redundant shift registers are connected to the pull-up reset signal terminals RESET_PU of the j-th shift register units in the (p−N/2+1)-th to p-th shift registers, respectively; the signal output terminals OUTPUT of j-th redundant shift register units in (N/2+1)-th to N-th redundant shift registers are connected to the pull-up reset signal terminals RESET_PU of the j-th redundant shift register units in the first to (N/2)-th redundant shift registers, respectively; where j takes 1 to q.

It can be seen that the (p−N/2+1)-th to p-th shift registers are reset through signals output by the first to (N/2)-th redundant shift registers; at the same time, the first to (N/2)-th redundant shift registers are reset through signals output by the (N/2+1)-th to N-th redundant shift registers, so as to ensure normal operation of the first to (N/2)-th redundant shift registers.

A cascade relationship of shift registers will be described below by taking a case where the number N of clock signal lines is an even number greater than or equal to 4 and the duty ratio of the clock signal is 40% as an example.

Figure 10:
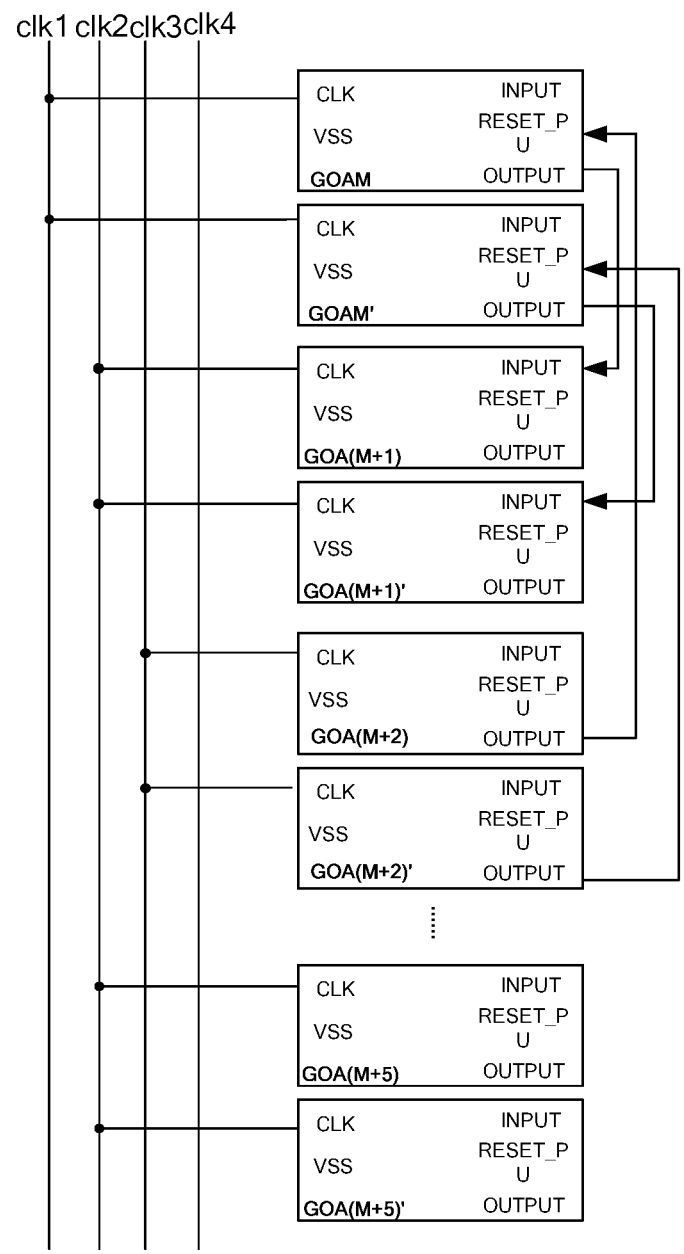
FIG. 10 is a schematic diagram of a cascade of shift registers in a case where the number of clock signal lines is 4 and a duty ratio of a clock signal is 40% according to an embodiment of the present disclosure.

For example, as shown in FIG. 10, the number N of clock signal lines is equal to 4, and the 4 clock signal lines are first to fourth clock signal lines clk1, clk2, . . . , and clk4, respectively, each group includes two rows of pixel units, in this case, j takes 1 to 2, that is, each of the p shift registers includes two shift register units. In this case, every adjacent four shift registers are connected to the first to fourth clock signal lines clk1, clk2, . . . , and clk4, respectively, and the two shift register units in each shift register are connected to a same clock signal line. Certainly, the display panel further includes 4 redundant shift registers, and each redundant shift register also includes two shift register units. First to fourth redundant shift registers of the 4 redundant shift registers are connected to the first to fourth clock signal lines clk1, clk2, . . . , and clk4, respectively, and the two shift register units of each redundant shift register are connected to a same clock signal line. The signal input terminals INPUT of the two shift register units in the first shift register are both connected to the frame start signal line, that is, the two shift register units of the first shift register respond to the frame start signal. The signal output terminal OUTPUT of a first shift register unit in an M-th shift register is connected to the signal input terminal INPUT of a first shift register unit in an (M+1)-th shift register; and the signal output terminal OUTPUT of a second shift register unit in the M-th shift register is connected to the signal input terminal INPUT of a second shift register unit in the (M+1)-th shift register; where M takes 1 to p−1. The pull-up reset signal terminal RESET_PU of a first shift register unit in an L-th shift register is connected to the signal output terminal OUTPUT of a first shift register unit in an (L+2)-th shift register; and the pull-up reset signal terminal RESET_PU of a second shift register unit in the L-th shift register is connected to the signal output terminal OUTPUT of a second shift register unit in the (L+2)-th shift register; where L takes 1 to p−2.

In addition, the signal output terminal OUTPUT of a first shift register unit in a p-th shift register is connected to the signal input terminal INPUT of a first redundant shift register unit in the first redundant shift register; the signal output terminal OUTPUT of a second shift register unit in the p-th shift register is connected to the signal input terminal INPUT of a second redundant shift register unit in the first redundant shift register; the signal output terminal OUTPUT of a first redundant shift register unit in a K-th redundant shift register is connected to the signal input terminal INPUT of a first redundant shift register unit in a (K+1)-th redundant shift register; and the signal output terminal OUTPUT of a second redundant shift register unit in the K-th redundant shift register is connected to the signal input terminal INPUT of a second redundant shift register unit in the (K+1)-th redundant shift register; where K takes 1 to 3. The signal output terminals OUTPUT of first redundant shift register units in the first and second redundant shift registers are connected to the pull-up reset signal terminals RESET_PU of first shift register units in the (p−1)-th and p-th shift registers, respectively; the signal output terminals OUTPUT of second redundant shift register units in the first and second redundant shift registers are connected to the pull-up reset signal terminals RESET_PU of second shift register units in the (p−1)-th and p-th shift registers, respectively; the signal output terminals OUTPUT of first redundant shift register units in the third and fourth redundant shift registers are connected to the pull-up reset signal terminals RESET_PU of the first redundant shift register units in the first and second redundant shift registers, respectively; and the signal output terminals OUTPUT of the second redundant shift register units in the third and fourth redundant shift registers are connected to the pull-up reset signal terminals RESET_PU of the second redundant shift register units in the first and second redundant shift registers, respectively.

Figure 11:
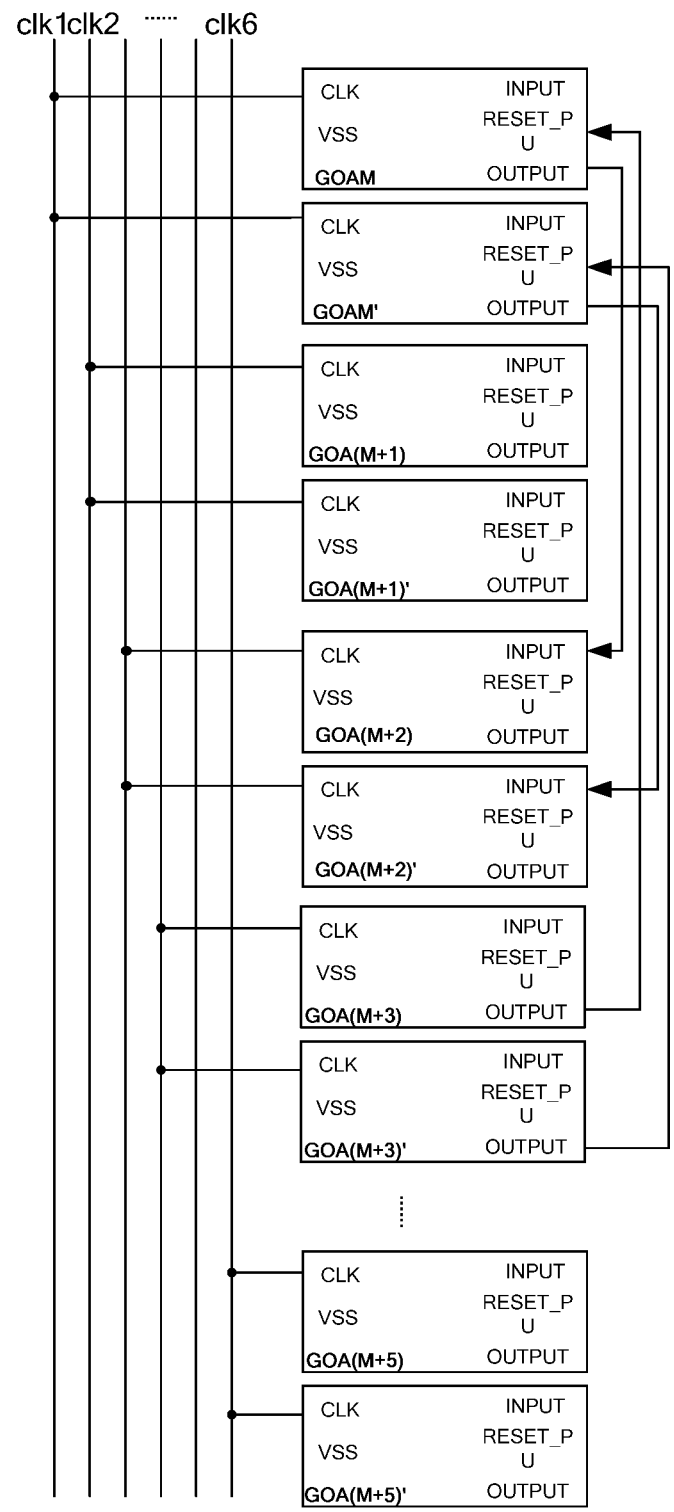
FIG. 11 is a schematic diagram of a cascade of shift registers in a case where the number of clock signal lines is 6 and a duty ratio of a clock signal is 40% according to an embodiment of the present disclosure.

For example, as shown in FIG. 11, the number N of clock signal lines is equal to 6, and the 6 clock signal lines are first to sixth clock signal lines clk1, clk2, . . . , and clk6, respectively; each group includes two rows of pixel units, and in this case, j takes 1 to 2, that is, each of the p shift registers includes two shift register units. In this case, every adjacent six shift registers are connected to the first to sixth clock signal lines clk1, clk2, . . . , and clk6, respectively, and the two shift register units in each shift register are connected to a same clock signal line. Certainly, the display panel further includes 6 redundant shift registers, and each redundant shift register also includes two shift register units. First to sixth redundant shift registers of the 6 redundant shift registers are connected to the first to sixth clock signal lines clk1, clk2, . . . , and clk6, respectively, and the two shift register units of each redundant shift register are connected to a same clock signal line. The signal input terminals INPUT of the two shift register units in each of first and second shift registers are connected to the frame start signal line, that is, the two shift register units of each of the first and second shift registers respond to the frame start signal. The signal output terminal OUTPUT of a first shift register unit in an M-th shift register is connected to the signal input terminal INPUT of a first shift register unit in an (M+2)-th shift register; and the signal output terminal OUTPUT of a second shift register unit in the M-th shift register is connected to the signal input terminal INPUT of a second shift register unit in the (M+2)-th shift register; where M takes 1 to p−2. The pull-up reset signal terminal RESET_PU of a first shift register unit in an L-th shift register is connected to the signal output terminal OUTPUT of a first shift register unit in an (L+3)-th shift register; and the pull-up reset signal terminal RESET_PU of a second shift register unit in the L-th shift register is connected to the signal output terminal OUTPUT of a second shift register unit in the (L+3)-th shift register; where L takes 1 to p−3.

In addition, the signal output terminals OUTPUT of first shift register units in (p−1)-th and p-th shift registers are connected to the signal input terminals INPUT of first redundant shift register units in the first and second redundant shift registers, respectively; the signal output terminals OUTPUT of second shift register units in the (p−1)-th and p-th shift registers are connected to the signal input terminals INPUT of second redundant shift register units in the first and second redundant shift registers, respectively; the signal output terminal OUTPUT of a first redundant shift register unit in a K-th redundant shift register is connected to the signal input terminal INPUT of a first redundant shift register unit in a (K+2)-th redundant shift register; and the signal output terminal OUTPUT of a second redundant shift register unit in the K-th redundant shift register is connected to the signal input terminal INPUT of a second redundant shift register unit in the (K+2)-th redundant shift register;

and K takes 1 to 2. The signal output terminals OUTPUT of first redundant shift register units in the first to third redundant shift registers are connected to the pull-up reset signal terminals RESET_PU of first shift register units in the (p−2)-th to p-th shift registers, respectively; the signal output terminals OUTPUT of second redundant shift register units in the first to third redundant shift registers are connected to the pull-up reset signal terminals RESET_PU of second shift register units in the (p−2)-th to p-th shift registers, respectively; the signal output terminals OUTPUT of first redundant shift register units in the fourth to sixth redundant shift registers are connected to the pull-up reset signal terminals RESET_PU of the first redundant shift register units in the first to third redundant shift registers, respectively; and the signal output terminals OUTPUT of the second redundant shift register units in the fourth to sixth redundant shift registers are connected to the pull-up reset signal terminals RESET_PU of the second redundant shift register units in the first to third redundant shift registers, respectively.

Figure 12:
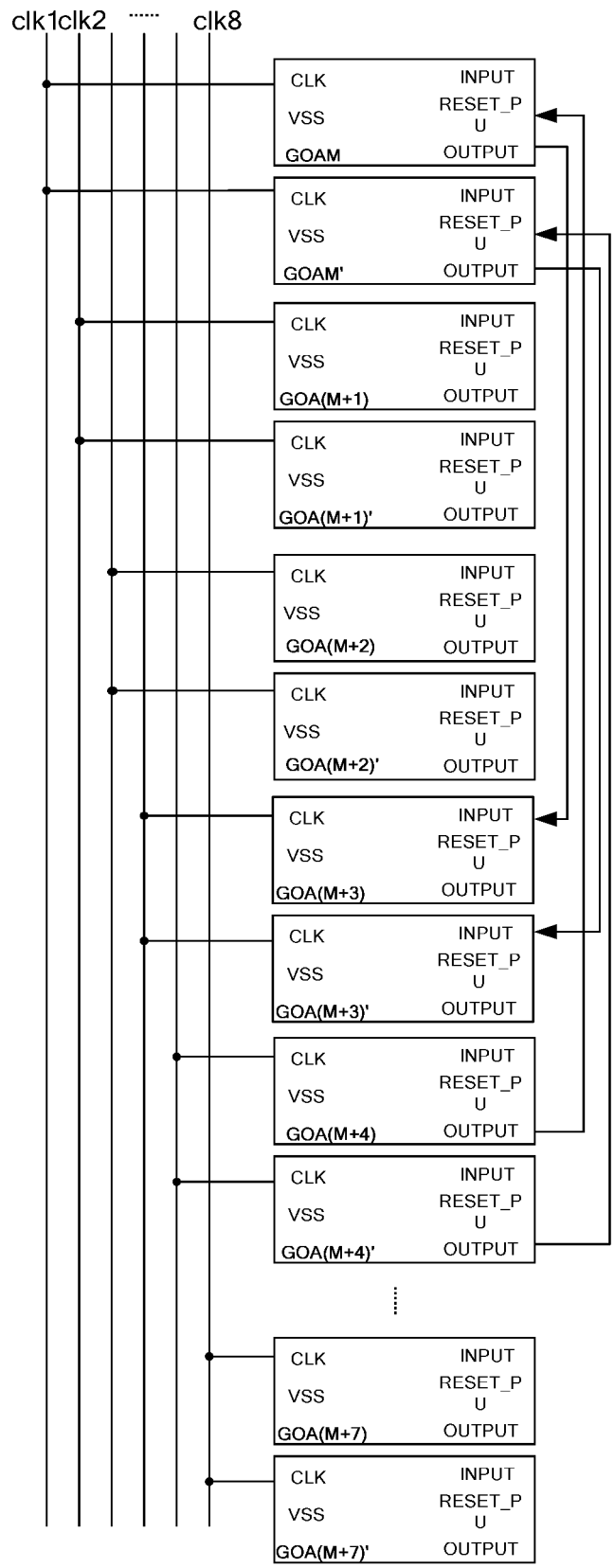
FIG. 12 is a schematic diagram of a cascade of shift registers in a case where the number of clock signal lines is 8 and a duty ratio of a clock signal is 40% according to an embodiment of the present disclosure.

For example, as shown in FIG. 12, the number N of clock signal lines is equal to 8, and the 8 clock signal lines are first to eighth clock signal lines clk1, clk2, . . . , and clk8, respectively, each group includes two rows of pixel units, and in this case, j takes 1 to 2, that is, each of the p shift registers includes two shift register units. In this case, every adjacent eight shift registers are connected to the first to eighth clock signal lines clk1, clk2, . . . , and clk8, respectively, and the two shift register units in each shift register are connected to a same clock signal line. Certainly, the display panel further includes 8 redundant shift registers, and each redundant shift register also includes two shift register units. The 8 redundant shift registers are respectively connected to the first to eighth clock signal lines clk1, clk2, . . . , and clk8, and the two shift register units of each redundant shift register are connected to a same clock signal line. The signal input terminals INPUT of the two shift register units in each of first to third shift registers are connected to the frame start signal line, that is, the two shift register units of each of the first to third shift registers respond to the frame start signal. The signal output terminal OUTPUT of a first shift register unit in an M-th shift register is connected to the signal input terminal INPUT of a first shift register unit in an (M+3)-th shift register; and the signal output terminal OUTPUT of a second shift register unit in the M-th shift register is connected to the signal input terminal INPUT of a second shift register unit in the (M+3)-th shift register; where M takes 1 to p−3. The pull-up reset signal terminal RESET_PU of a first shift register unit in an L-th shift register is connected to the signal output terminal OUTPUT of a first shift register unit in an (L+4)-th shift register; and the pull-up reset signal terminal RESET_PU of a second shift register unit in the L-th shift register is connected to the signal output terminal OUTPUT of a second shift register unit in the (L+4)-th shift register; where L takes 1 to p−4.

In addition, the signal output terminals OUTPUT of first shift register units in (p−2)-th to p-th shift registers are connected to the signal input terminals INPUT of first redundant shift register units in the first to third redundant shift registers, respectively; the signal output terminals OUTPUT of second shift register units in the (p−2)-th to p-th shift registers are connected to the signal input terminals INPUT of second redundant shift register units in the first to third redundant shift registers, respectively; the signal output terminal OUTPUT of a first redundant shift register unit in a K-th redundant shift register is connected to the signal input terminal INPUT of a first redundant shift register unit in a (K+3)-th redundant shift register; and the signal output terminal OUTPUT of a second redundant shift register unit in the K-th redundant shift register is connected to the signal input terminal INPUT of a second redundant shift register unit in the (K+3)-th redundant shift register; where K takes 1 to 5. The signal output terminals OUTPUT of first redundant shift register units in the first to fourth redundant shift registers are connected to the pull-up reset signal terminals RESET_PU of first shift register units in the (p−3)-th to p-th shift registers, respectively; the signal output terminals OUTPUT of first redundant shift register units in the fifth to eighth redundant shift registers are connected to the pull-up reset signal terminals RESET_PU of the first redundant shift register units in the first to fourth redundant shift registers, respectively; the signal output terminals OUTPUT of second redundant shift register units in the first to fourth redundant shift registers are connected to the pull-up reset signal terminals RESET_PU of second shift register units in the (p−3)-th to p-th shift registers, respectively; and the signal output terminals OUTPUT of the second redundant shift register units in the fifth to eighth redundant shift registers are connected to the pull-up reset signal terminals RESET_PU of the second redundant shift register units in the first to fourth redundant shift registers, respectively.

Figure 13:
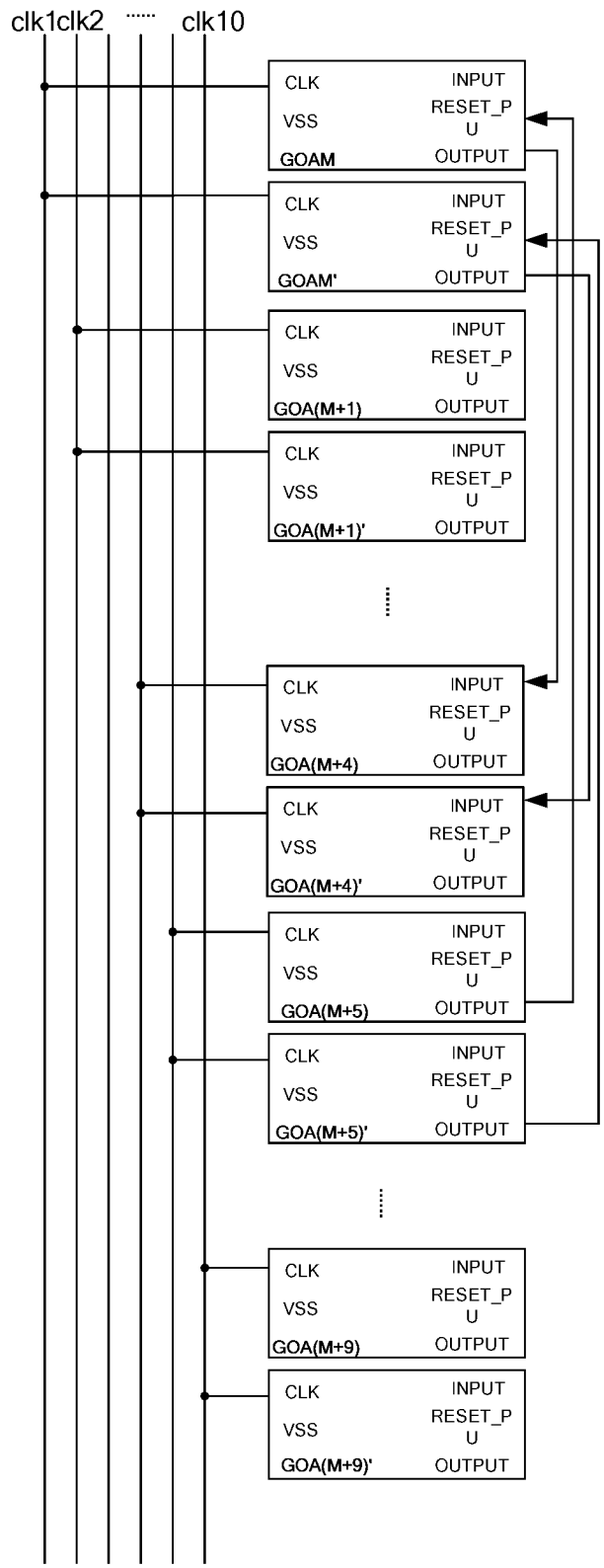
FIG. 13 is a schematic diagram of a cascade of shift registers in a case where the number of clock signal lines is 10 and a duty ratio of a clock signal is 40% according to an embodiment of the present disclosure.

For example, as shown in FIG. 13, the number N of clock signal lines is equal to 10, the 10 clock signal lines are first to tenth clock signal lines clk1, clk2, . . . , and clk10, respectively; each group includes two rows of pixel units, and in this case, j takes 1 to 2, that is, each of the p shift registers includes two shift register units. In this case, every adjacent ten shift registers are connected to the first to tenth clock signal lines clk1, clk2, . . . , and clk10, respectively, and the two shift register units in each shift register are connected to a same clock signal line. Certainly, the display panel further includes 10 redundant shift registers, and each redundant shift register also includes two shift register units. First to tenth redundant shift registers are respectively connected to the first to tenth clock signal lines clk1, clk2, . . . , and clk10, and the two shift register units of each redundant shift register are connected to a same clock signal line. The signal input terminals INPUT of the two shift register units in each of first to fourth shift registers are connected to the frame start signal line, that is, the two shift register units of each of the first to fourth shift registers respond to the frame start signal. The signal output terminal OUTPUT of a first shift register unit in an M-th shift register is connected to the signal input terminal INPUT of a first shift register unit in an (M+4)-th shift register; and the signal output terminal OUTPUT of a second shift register unit in the M-th shift register is connected to the signal input terminal INPUT of a second shift register unit in the (M+4)-th shift register; where M takes 1 to p−4. The pull-up reset signal terminal RESET_PU of a first shift register unit in an L-th shift register is connected to the signal output terminal OUTPUT of a first shift register unit in an (L+5)-th shift register; and the pull-up reset signal terminal RESET_PU of a second shift register unit in the L-th shift register is connected to the signal output terminal OUTPUT of a second shift register unit in the (L+5)-th shift register; where L takes 1 to p−5.

In addition, the signal output terminals OUTPUT of first shift register units in (p−3)-th to p-th shift registers are connected to the signal input terminals INPUT of first redundant shift register units in the first to fourth redundant shift registers, respectively; the signal output terminals OUTPUT of second shift register units in the (p−3)-th to p-th shift registers are connected to the signal input terminals INPUT of second redundant shift register units in the first to fourth redundant shift registers, respectively; the signal output terminal OUTPUT of a first redundant shift register unit in a K-th redundant shift register is connected to the signal input terminal INPUT of a first redundant shift register unit in a (K+4)-th redundant shift register; and the signal output terminal OUTPUT of a second redundant shift register unit in the K-th redundant shift register is connected to the signal input terminal INPUT of a second redundant shift register unit in the (K+4)-th redundant shift register; where K takes 1 to 6. The signal output terminals OUTPUT of first redundant shift register units in the first to fifth redundant shift registers are connected to the pull-up reset signal terminals RESET_PU of first shift register units in the (p−4)-th to p-th shift registers, respectively; the signal output terminals OUTPUT of second redundant shift register units in the first to fifth redundant shift registers are connected to the pull-up reset signal terminals RESET_PU of second shift register units in the (p−4)-th to p-th shift registers, respectively; the signal output terminals OUTPUT of first redundant shift register units in the sixth to tenth redundant shift registers are connected to the pull-up reset signal terminals RESET_PU of the first redundant shift register units in the first to fifth redundant shift registers, respectively; and the signal output terminals OUTPUT of the second redundant shift register units in the sixth to tenth redundant shift registers are connected to the pull-up reset signal terminals RESET_PU of the second redundant shift register units in the first to fifth redundant shift registers, respectively.

In another exemplary embodiment, in a case where the number N of the clock signal lines is an even number greater than or equal to 4, and the duty ratio of the clock signal is 50%, the signal input terminal INPUT of each shift register unit in first to (N/2)-th shift registers of the register unit responds to the frame start signal; the signal output terminal OUTPUT of a j-th shift register unit in an M-th shift register is connected to the signal input terminal INPUT of a j-th shift register unit in an (M+N/2)-th shift register; and the pull-up reset signal terminal RESET_PU of a j-th shift register unit in an L-th shift register is connected to the signal output terminal OUTPUT of a j-th shift register unit in an [L+(N/2+1)]-th shift register; where M takes 1 to p−N/2; L takes 1 to p−(N/2+1); and j takes 1 to q.

In addition, since the signal output terminal OUTPUT of the p-th shift register (which is the shift register in the last stage) is connected to the pull-up reset signal terminal RESET_PU of the [p−(N/2+1)]-th shift register unit, no shift registers provide a reset signal for the pull-up node UP of each shift register unit of (p−N/2)-th to p-th shift registers. According to the above, for a reset signal for the pull-up node PU of the j-th shift register unit of the p-th shift register, the signal output terminal OUTPUT of a j-th shift register unit of a (p+N/2+1)-th shift register is required; at the same time, it is necessary to ensure that the j-th shift register unit of the (p+N/2+1)-th shift register can operate normally, and therefore N+2 shift registers need to be added. Therefore, in some embodiments, N+2 redundant shift registers are further provided in the display panel. First to N-th redundant shift registers of the N+2 redundant shift registers are connected to the N clock signal lines, respectively, (N+1)-th and (N+2)-th redundant shift registers of the N+2 redundant shift registers are connected to the first and second clock signal lines, respectively, and each redundant shift register includes q redundant shift register units (which are the same as the shift register units in each shift register). The signal output terminals OUTPUT of j-th redundant shift register units in first to (N/2+1)-th redundant shift registers are connected to the pull-up reset signal terminals RESET_PU of the j-th shift register units in the (p−N/2)-th to p-th shift registers, respectively; and the signal output terminals OUTPUT of j-th redundant shift register units in (N/2+2)-th to (N+2)-th redundant shift registers are connected to the pull-up reset signal terminals RESET_PU of the j-th redundant shift register units in the first to (N/2+1)-th redundant shift registers, respectively; where j takes 1 to q.

It can be seen that the (p−N/2)-th to p-th shift registers are reset through signals output by the first to (N/2+1)-th redundant shift registers; at the same time, the first to (N/2+1)-th redundant shift registers are reset through signals output by the (N/2+2)-th to (N+2)-th redundant shift registers, so as to ensure normal operation of the first to (N/2+1)-th redundant shift registers.

A cascade relationship of shift registers will be described below by taking a case where the number N of clock signal lines is an even number greater than or equal to 4 and the duty ratio of the clock signal is 50% as an example.

Figure 14:
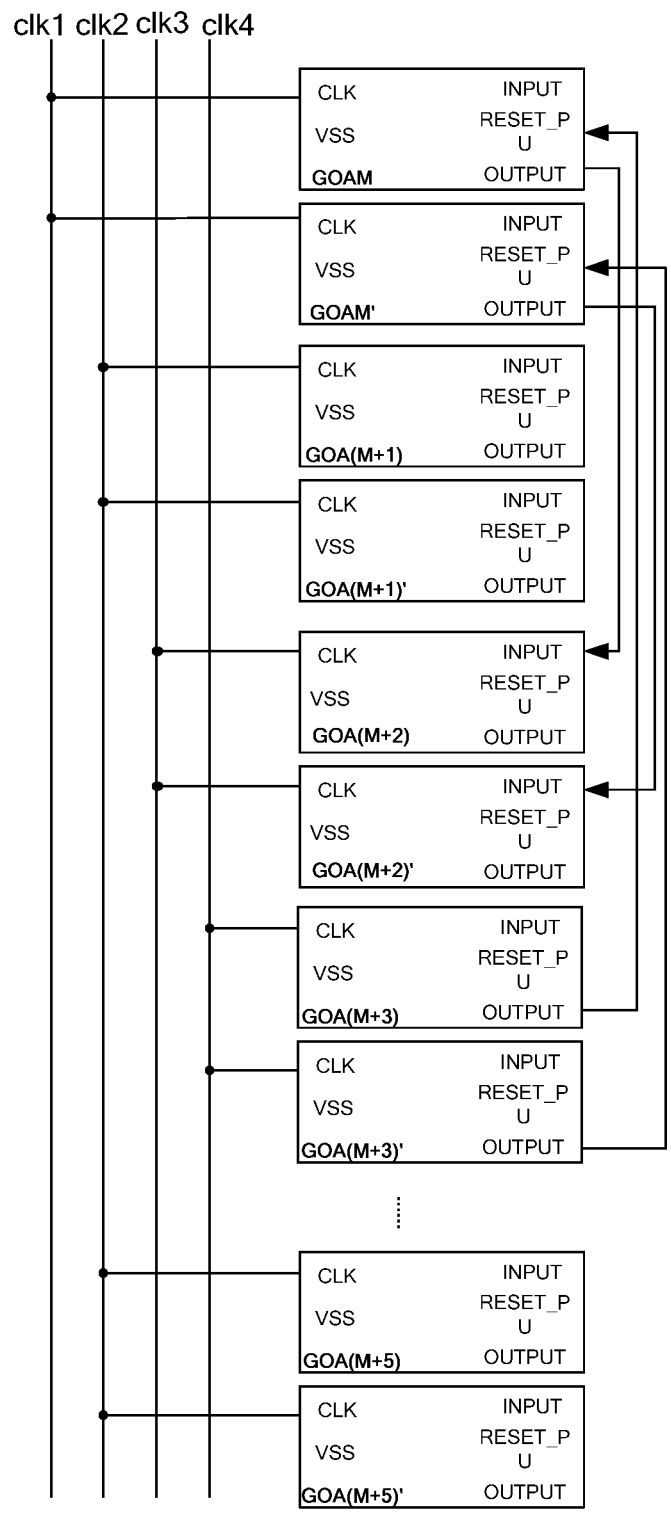
FIG. 14 is a schematic diagram of a cascade of shift registers in a case where the number of clock signal lines is 4 and a duty ratio of a clock signal is 50% according to an embodiment of the present disclosure.

For example, as shown in FIG. 14, the number N of clock signal lines is equal to 4, the 4 clock signal lines are first to fourth clock signal lines clk1, clk2, . . . , and clk4, respectively, each group includes two rows of pixel units, and in this case, j takes 1 to 2, that is, each of the p shift registers includes two shift register units. In this case, every adjacent four shift registers are connected to the first to fourth clock signal lines clk1, clk2, . . . , and clk4, respectively, and the two shift register units in each shift register are connected to a same clock signal line. Certainly, the display panel further includes 6 redundant shift registers, and each redundant shift register also includes two shift register units. First to fourth redundant shift registers of the 6 redundant shift registers are connected to the first to fourth clock signal lines clk1, clk2, . . . , and clk4, respectively, fifth and sixth redundant shift registers of the 6 redundant shift registers are connected to the first and second clock signal lines clk1 and clk2, respectively, and the two shift register units of each redundant shift register are connected to a same clock signal line. The signal input terminals INPUT of the two shift register units in each of the first and second shift registers are both connected to the frame start signal line, that is, the two shift register units of each of the first and second shift registers respond to the frame start signal. The signal output terminal OUTPUT of a first shift register unit in an M-th shift register is connected to the signal input terminal INPUT of a first shift register unit in an (M+2)-th shift register; and the signal output terminal OUTPUT of a second shift register unit in the M-th shift register is connected to the signal input terminal INPUT of a second shift register unit in the (M+2)-th shift register; where M takes 1 to p−2. The pull-up reset signal terminal RESET_PU of a first shift register unit in an L-th shift register is connected to the signal output terminal OUTPUT of a first shift register unit in an (L+3)-th shift register; and the pull-up reset signal terminal RESET_PU of a second shift register unit in the L-th shift register is connected to the signal output terminal OUTPUT of a second shift register unit in the (L+3)-th shift register; where L takes 1 to p−3.

In addition, the signal output terminals OUTPUT of first shift register units in (p−1)-th and p-th shift registers are connected to the signal input terminals INPUT of first redundant shift register units in the first and second redundant shift registers, respectively; the signal output terminals OUTPUT of second shift register units in the (p−1)-th and p-th shift registers are connected to the signal input terminals INPUT of second redundant shift register units in the first and second redundant shift registers, respectively; the signal output terminal OUTPUT of a first redundant shift register unit in a K-th redundant shift register is connected to the signal input terminal INPUT of a first redundant shift register unit in a (K+2)-th redundant shift register; and the signal output terminal OUTPUT of a second redundant shift register unit in the K-th redundant shift register is connected to the signal input terminal INPUT of a second redundant shift register unit in the (K+2)-th redundant shift register; where K takes 1 to 4. The signal output terminals OUTPUT of first redundant shift register units in the first to third redundant shift registers are connected to the pull-up reset signal terminals RESET_PU of first shift register units in the (p−2)-th to p-th shift registers, respectively; the signal output terminals OUTPUT of second redundant shift register units in the first to third redundant shift registers are connected to the pull-up reset signal terminals RESET_PU of second shift register units in the (p−2)-th to p-th shift registers, respectively; the signal output terminals OUTPUT of first redundant shift register units in the fourth to sixth redundant shift registers are connected to the pull-up reset signal terminals RESET_PU of the first redundant shift register units in the first to third redundant shift registers, respectively; and the signal output terminals OUTPUT of the second redundant shift register units in the fourth to sixth redundant shift registers are connected to the pull-up reset signal terminals RESET_PU of the second redundant shift register units in the first to third redundant shift registers, respectively.

Figure 15:
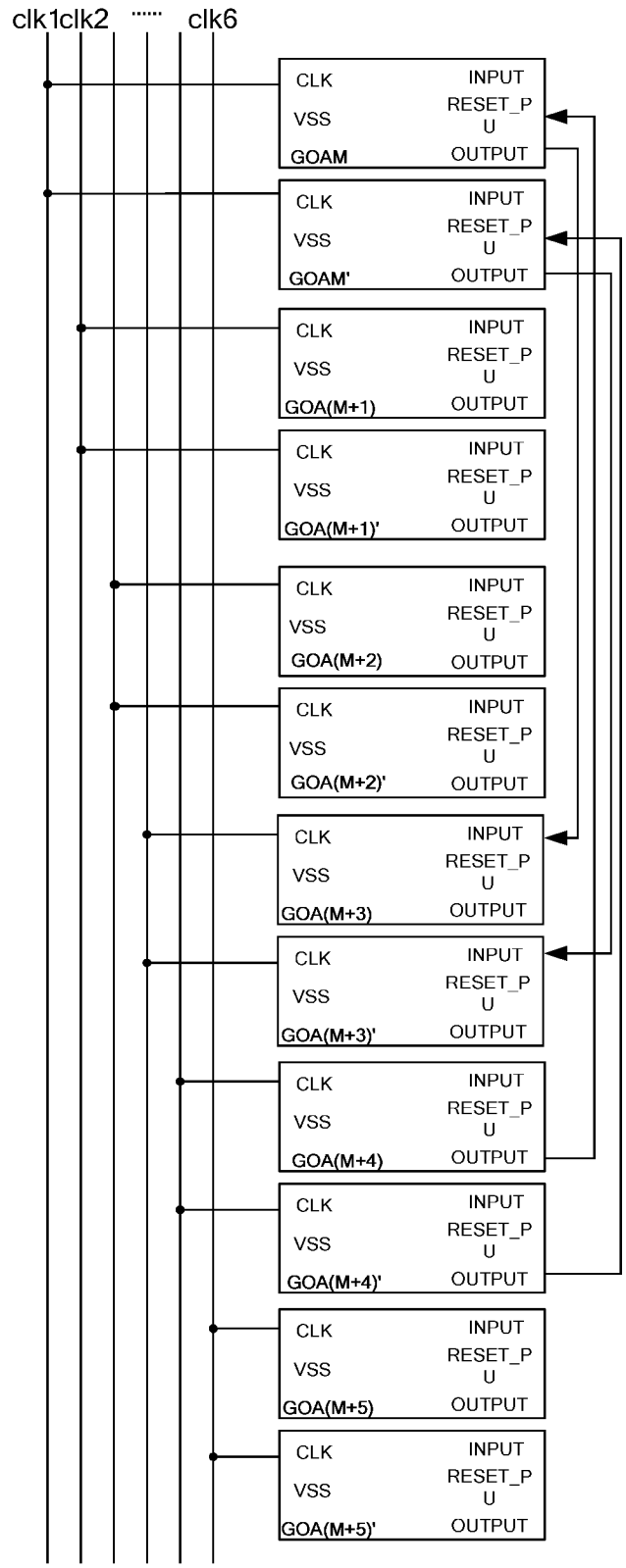
FIG. 15 is a schematic diagram of a cascade of shift registers in a case where the number of clock signal lines is 6 and a duty ratio of a clock signal is 50% according to an embodiment of the present disclosure.

For example, as shown in FIG. 15, the number N of clock signal lines is equal to 6, the 6 clock signal lines are first to sixth clock signal lines clk1, clk2, . . . , and clk6, respectively, each group includes two rows of pixel units, and in this case, j takes 1 to 2, that is, each of the p shift registers includes two shift register units. In this case, every adjacent six shift registers are connected to the first to sixth clock signal lines clk1, clk2, . . . , and clk6, respectively, and the two shift register units in each shift register are connected to a same clock signal line. Certainly, the display panel further includes 8 redundant shift registers, and each redundant shift register also includes two shift register units. First to sixth redundant shift registers of the 8 redundant shift registers are connected to the first to sixth clock signal lines clk1, clk2, . . . , and clk6, respectively, seventh and eighth redundant shift registers of the 8 redundant shift registers are connected to the first and second clock signal lines clk1 and clk2, respectively, and the two shift register units of each redundant shift register are connected to a same clock signal line. The signal input terminals INPUT of the two shift register units in each of first and second shift registers are connected to the frame start signal line, that is, the two shift register units of each of the first and second shift registers respond to the frame start signal. The signal output terminal OUTPUT of a first shift register unit in an M-th shift register is connected to the signal input terminal INPUT of a first shift register unit in an (M+3)-th shift register; and the signal output terminal OUTPUT of a second shift register unit in the M-th shift register is connected to the signal input terminal INPUT of a second shift register unit in the (M+3)-th shift register; where M takes 1 to p−3. The pull-up reset signal terminal RESET_PU of a first shift register unit in an L-th shift register is connected to the signal output terminal OUTPUT of a first shift register unit in an (L+4)-th shift register; and the pull-up reset signal terminal RESET_PU of a second shift register unit in the L-th shift register is connected to the signal output terminal OUTPUT of a second shift register unit in the (L+4)-th shift register; where L takes 1 to p−4.

In addition, the signal output terminals OUTPUT of first shift register units in (p−2)-th to p-th shift registers are connected to the signal input terminals INPUT of first redundant shift register units in the first to third redundant shift registers, respectively; the signal output terminals OUTPUT of second shift register units in the (p−2)-th to p-th shift registers are connected to the signal input terminals INPUT of second redundant shift register units in the first to third redundant shift registers, respectively; the signal output terminal OUTPUT of a first redundant shift register unit in a K-th redundant shift register is connected to the signal input terminal INPUT of a first redundant shift register unit in a (K+3)-th redundant shift register; and the signal output terminal OUTPUT of a second redundant shift register unit in the K-th redundant shift register is connected to the signal input terminal INPUT of a second redundant shift register unit in the (K+3)-th redundant shift register; where K takes 1 to 3. The signal output terminals OUTPUT of first redundant shift register units in the first to fourth redundant shift registers are connected to the pull-up reset signal terminals RESET_PU of first shift register units in the (p−3)-th to p-th shift registers, respectively; the signal output terminals OUTPUT of second redundant shift register units in the first to fourth redundant shift registers are connected to the pull-up reset signal terminals RESET_PU of second shift register units in the (p−3)-th to p-th shift registers, respectively; the signal output terminals OUTPUT of first redundant shift register units in the fifth to eighth redundant shift registers are connected to the pull-up reset signal terminals RESET_PU of the first redundant shift register units in the first to fourth redundant shift registers, respectively; and the signal output terminals OUTPUT of the second redundant shift register units in the fifth to eighth redundant shift registers are connected to the pull-up reset signal terminals RESET_PU of the second redundant shift register units in the first to fourth redundant shift registers, respectively.

Figure 16:
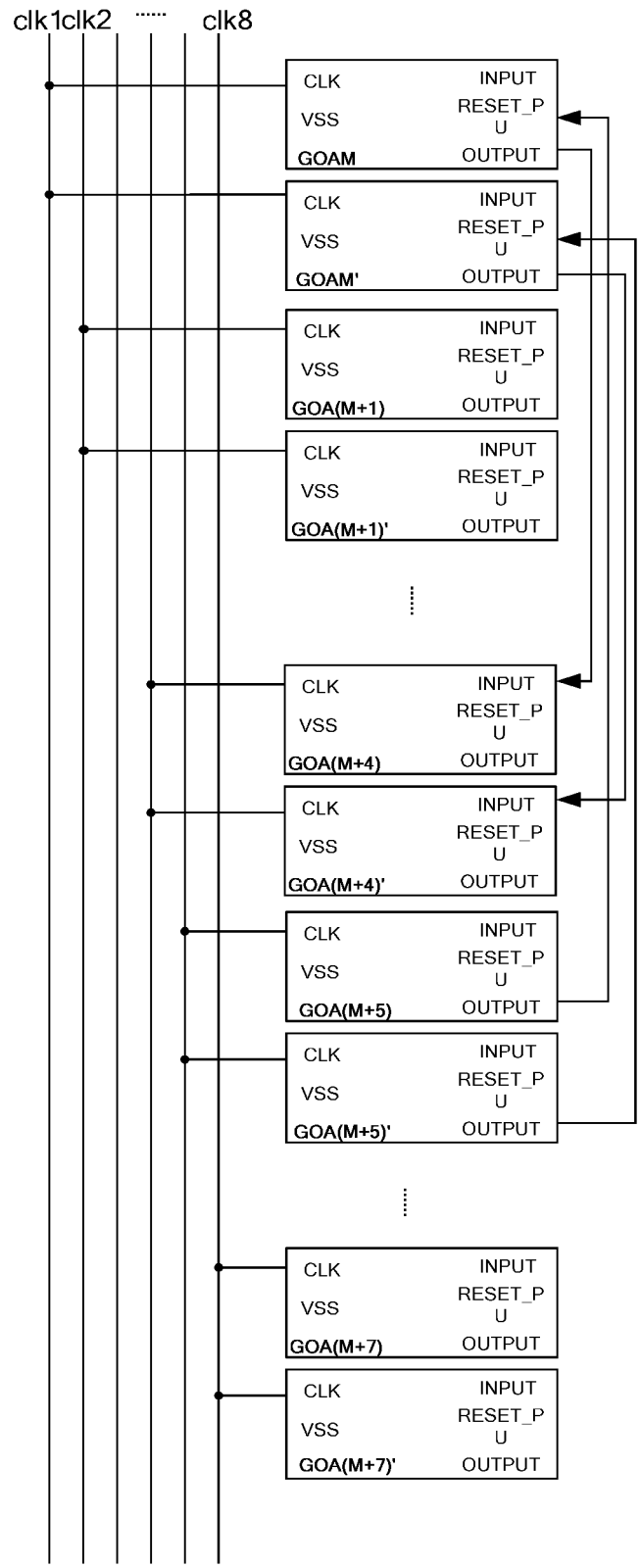
FIG. 16 is a schematic diagram of a cascade of shift registers in a case where the number of clock signal lines is 8 and a duty ratio of a clock signal is 50% according to an embodiment of the present disclosure.

For example, as shown in FIG. 16, the number N of clock signal lines is equal to 8, the 8 clock signal lines are first to eighth clock signal lines clk1, clk2, . . . , and clk8, respectively, each group includes two rows of pixel units, and in this case, j takes 1 to 2, that is, each of the p shift registers includes two shift register units. In this case, every adjacent eight shift registers are connected to the first to eighth clock signal lines clk1, clk2, . . . , and clk8, respectively, and the two shift register units in each shift register are connected to a same clock signal line. Certainly, the display panel further includes 10 redundant shift registers, and each redundant shift register also includes two shift register units. First to eighth redundant shift registers of the 10 redundant shift registers are connected to the first to eighth clock signal lines clk1, clk2, . . . , and clk8, respectively, ninth and tenth redundant shift registers of the 10 redundant shift registers are connected to the first and second clock signal lines clk1 and clk2, respectively, and the two shift register units of each redundant shift register are connected to a same clock signal line. The signal input terminals INPUT of the two shift register units in each of first to fourth shift registers are connected to the frame start signal line, that is, the two shift register units of each of the first to fourth shift registers respond to the frame start signal. The signal output terminal OUTPUT of a first shift register unit in an M-th shift register is connected to the signal input terminal INPUT of a first shift register unit in an (M+4)-th shift register; and the signal output terminal OUTPUT of a second shift register unit in the M-th shift register is connected to the signal input terminal INPUT of a second shift register unit in the (M+4)-th shift register; where M takes 1 to p−4. The pull-up reset signal terminal RESET_PU of a first shift register unit in an L-th shift register is connected to the signal output terminal OUTPUT of a first shift register unit in an (L+5)-th shift register; and the pull-up reset signal terminal RESET_PU of a second shift register unit in the L-th shift register is connected to the signal output terminal OUTPUT of a second shift register unit in the (L+5)-th shift register; where L takes 1 to p−5.

In addition, the signal output terminals OUTPUT of first shift register units in (p−3)-th to p-th shift registers are connected to the signal input terminals INPUT of first redundant shift register units in the first to fourth redundant shift registers, respectively; the signal output terminals OUTPUT of second shift register units in the (p−3)-th to p-th shift registers are connected to the signal input terminals INPUT of second redundant shift register units in the first to fourth redundant shift registers, respectively; the signal output terminal OUTPUT of a first redundant shift register unit in a K-th redundant shift register is connected to the signal input terminal INPUT of a first redundant shift register unit in a (K+4)-th redundant shift register; and the signal output terminal OUTPUT of a second redundant shift register unit in the K-th redundant shift register is connected to the signal input terminal INPUT of a second redundant shift register unit in the (K+4)-th redundant shift register; where K takes 1 to 6. The signal output terminals OUTPUT of second redundant shift register units in the first to fifth redundant shift registers are connected to the pull-up reset signal terminals RESET_PU of second shift register units in the (p−4)-th to p-th shift registers, respectively; the signal output terminals OUTPUT of first redundant shift register units in the first to fifth redundant shift registers are connected to the pull-up reset signal terminals RESET_PU of first shift register units in the (p−4)-th to p-th shift registers, respectively; the signal output terminals OUTPUT of first redundant shift register units in the sixth to tenth redundant shift registers are connected to the pull-up reset signal terminals RESET_PU of the first redundant shift register units in the first to fifth redundant shift registers, respectively; and the signal output terminals OUTPUT of the second redundant shift register units in the sixth to tenth redundant shift registers are connected to the pull-up reset signal terminals RESET_PU of the second redundant shift register units in the first to fifth redundant shift registers, respectively.

Figure 17:
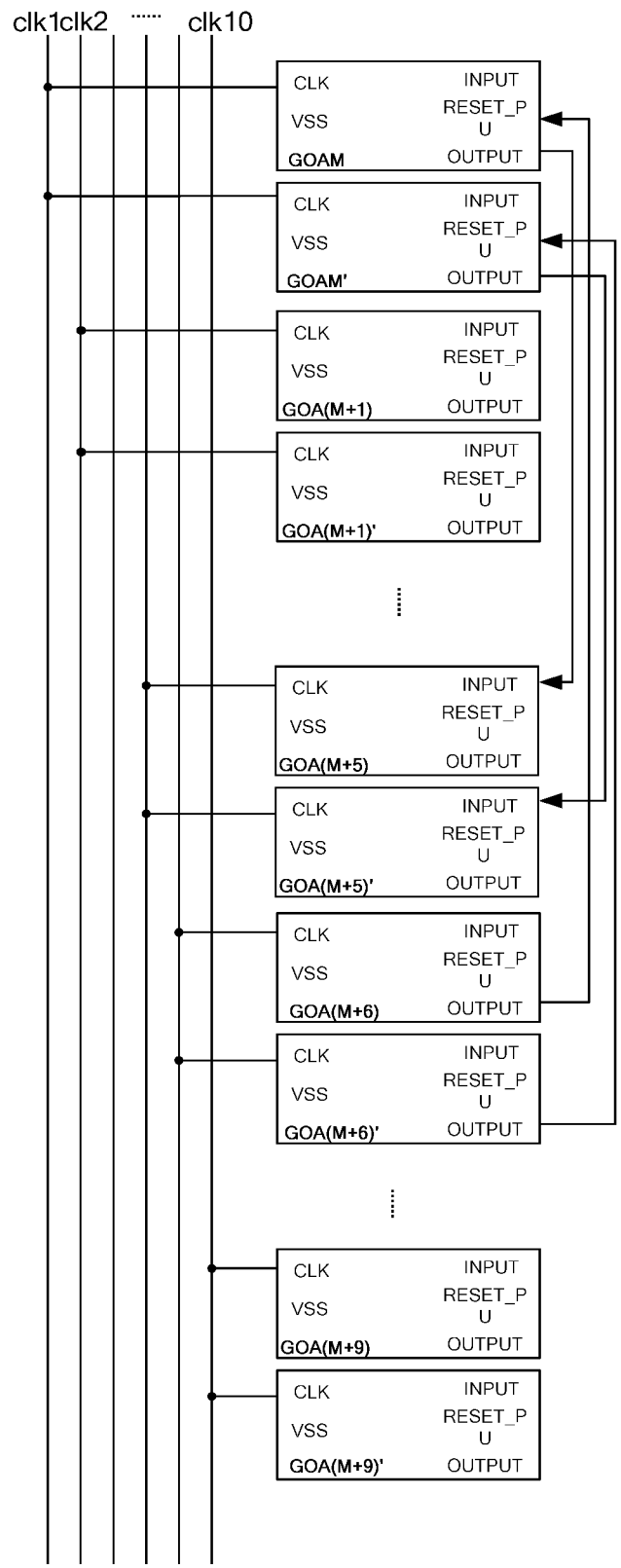
FIG. 17 is a schematic diagram of a cascade of shift registers in a case where the number of clock signal lines is 10 and a duty ratio of a clock signal is 50% according to an embodiment of the present disclosure.

For example, as shown in FIG. 17, the number N of clock signal lines is equal to 10, the 10 clock signal lines are first to tenth clock signal lines clk1, clk2, . . . , and clk10, respectively, each group includes two rows of pixel units, and in this case, j takes 1 to 2, that is, each of the p shift registers includes two shift register units. In this case, every adjacent ten shift registers are connected to the first to tenth clock signal lines clk1, clk2, . . . , and clk10, respectively, and the two shift register units in each shift register are connected to a same clock signal line. Certainly, the display panel further includes 12 redundant shift registers, and each redundant shift register also includes two shift register units. First to tenth redundant shift registers of the 12 redundant shift registers are connected to the first to tenth clock signal lines clk1, clk2, . . . , and clk10, respectively, and eleventh and twelfth redundant shift registers of the 12 redundant shift registers are connected to the first and second clock signal lines clk1 and clk2, respectively; and the two shift register units of each redundant shift register are connected to a same clock signal line. The signal input terminals INPUT of the two shift register units in each of first to fifth shift registers are connected to the frame start signal line, that is, the two shift register units of each of the first to fifth shift registers respond to the frame start signal. The signal output terminal OUTPUT of a first shift register unit in an M-th shift register is connected to the signal input terminal INPUT of a first shift register unit in an (M+5)-th shift register; and the signal output terminal OUTPUT of a second shift register unit in the M-th shift register is connected to the signal input terminal INPUT of a second shift register unit in the (M+5)-th shift register; where M takes 1 to p−5. The pull-up reset signal terminal RESET_PU of a first shift register unit in an L-th shift register is connected to the signal output terminal OUTPUT of a first shift register unit in an (L+6)-th shift register; and the pull-up reset signal terminal RESET_PU of a second shift register unit in the L-th shift register is connected to the signal output terminal OUTPUT of a second shift register unit in the (L+6)-th shift register; where L takes 1 to p−6.

In addition, the signal output terminals OUTPUT of first shift register units in (p−4)-th to p-th shift registers are connected to the signal input terminals INPUT of first redundant shift register units in the first to fifth redundant shift registers, respectively; the signal output terminals OUTPUT of second shift register units in the (p−4)-th to p-th shift registers are connected to the signal input terminals INPUT of second redundant shift register units in the first to fifth redundant shift registers, respectively; the signal output terminal OUTPUT of a first redundant shift register unit in a K-th redundant shift register is connected to the signal input terminal INPUT of a first redundant shift register unit in a (K+5)-th redundant shift register; and the signal output terminal OUTPUT of a second redundant shift register unit in the K-th redundant shift register is connected to the signal input terminal INPUT of a second redundant shift register unit in the (K+5)-th redundant shift register; where K takes 1 to 7. The signal output terminals OUTPUT of first redundant shift register units in the first to sixth redundant shift registers are connected to the pull-up reset signal terminals RESET_PU of first shift register units in the (p−5)-th to p-th shift registers, respectively; the signal output terminals OUTPUT of second redundant shift register units in the first to sixth redundant shift registers are connected to the pull-up reset signal terminals RESET_PU of second shift register units in the (p−5)-th to p-th shift registers, respectively; the signal output terminals OUTPUT of first redundant shift register units in the seventh to twelfth redundant shift registers are connected to the pull-up reset signal terminals RESET_PU of the first redundant shift register units in the first to sixth redundant shift registers, respectively; and the signal output terminals OUTPUT of the second redundant shift register units in the seventh to twelfth redundant shift registers are connected to the pull-up reset signal terminals RESET_PU of the second redundant shift register units in the first to sixth redundant shift registers, respectively.

Figure 18:
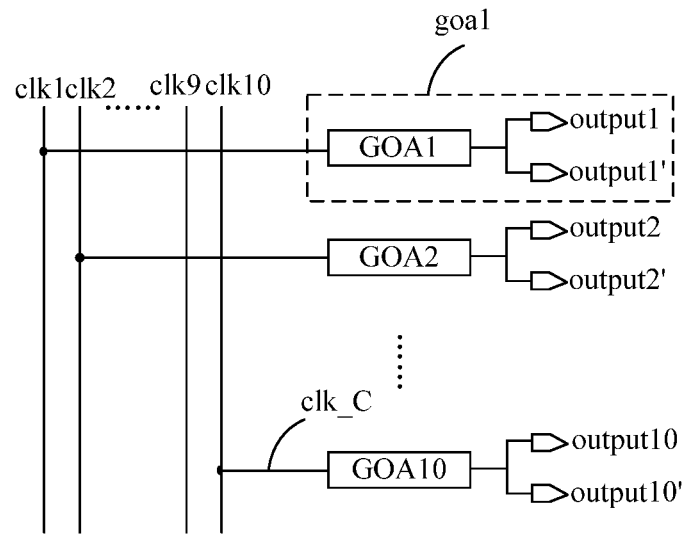
FIG. 18 is a schematic diagram illustrating still another connection between shift registers and clock signal lines according to an embodiment of the present disclosure.

In cases where each shift register includes one (e.g., only one) shift register unit and q sub signal output terminals OUTPUT, the number N of the clock signal lines is an even number greater than or equal to 4, and the duty ratio of a clock signal is 30%, 40%, and 50%, respectively, cascade relationships between shift register units will be described below. A case where q is equal to 2, that is, each shift register includes one (e.g., only one) shift register unit and 2 sub signal output terminals OUTPUT are taken as an example in FIG. 18. A certain shift register unit involved in the following description refers to the shift register unit of a shift register to which the certain shift register unit belongs.

In an exemplary embodiment, in a case where the number N of the clock signal lines is an even number greater than or equal to 6, and the duty ratio of the clock signal is 30%, the signal input terminals INPUT of first to (N−4)/2-th shift register units respond to the frame start signal; the signal output terminal OUTPUT of an M-th shift register unit is connected to the signal input terminal INPUT of an [M+(N−4)/2]-th shift register unit; and the pull-up reset signal terminal RESET_PU of an L-th shift register unit is connected to the signal output terminal OUTPUT of an [L+(N/2−1)]-th shift register unit; where M takes 1 to p−(N−4)/2; L takes 1 to p−(N/2−1); and j takes 1 to q.

In addition, since the signal output terminal OUTPUT of a p-th shift register unit (which is a shift register unit in a last stage) is connected to the pull-up reset signal terminal RESET_PU of a [p−(N/2−1)]-th shift register unit, no shift registers provide a reset signal for the pull-up node PU of each of [p−(N/2−2)]-th to p-th shift register units. According to the above, for a reset signal for the pull-up node PU of the p-th shift register unit, the signal output terminal OUTPUT of a [p+(N/2−1)]-th shift register unit is required; at the same time, it is necessary to ensure that the [p+(N/2−1)]-th shift register unit can operate normally, and therefore N−2 shift registers need to be added, that is, N−2 redundant shift register units need to be added. Therefore, in some embodiments, N−2 redundant shift registers are further provided in the display panel, the N−2 redundant shift registers are connected to N−2 clock signal lines, respectively, and each redundant shift register includes one shift register unit (which is the same as the shift register unit in each shift register, and to distinguish from the shift register unit described above, a redundant shift register is also referred to as a redundant shift register unit). The signal output terminals OUTPUT of first to (N/2−1)-th redundant shift register units are connected to the pull-up reset signal terminals RESET_PU of the (p−N/2)-th to p-th shift register units, respectively; and the signal output terminals OUTPUT of (N/2)-th to (N−2)-th redundant shift register units are connected to the pull-up reset signal terminals RESET_PU of the first to (N/2−1)-th redundant shift register units, respectively; where j takes 1 to q.

It can be seen that the [p−(N/2−2)]-th to p-th shift register units are reset through signals output by the first to (N/2−1)-th redundant shift register units; at the same time, the first to (N/2−1)-th redundant shift register units are reset through signals output by the (N/2)-th to (N−2)-th redundant shift register units, so as to ensure normal operation of the first to (N/2−1)-th redundant shift register units.

A cascade relationship of shift registers will be described below by taking a case where the number N of clock signal lines is an even number greater than or equal to 6 and the duty ratio of the clock signal is 30% as an example.

Figure 19:
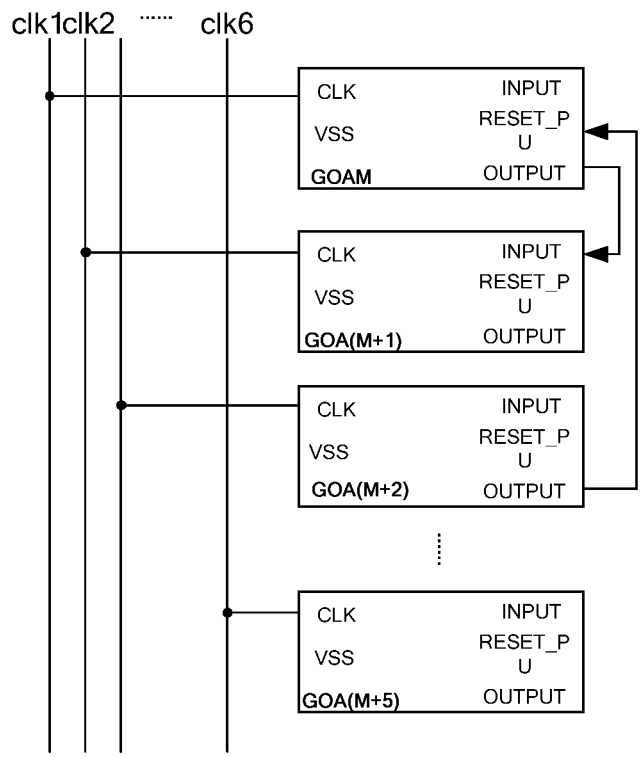
FIG. 19 is a schematic diagram of another cascade of shift registers in a case where the number of clock signal lines is 6 and a duty ratio of a clock signal is 30% according to an embodiment of the present disclosure.

For example, as shown in FIG. 19, the number N of the clock signal lines is equal to 6, the 6 clock signal lines are first to sixth clock signal lines clk1, clk2, . . . , and clk6, respectively, each group includes two rows of pixel units, and in this case, j takes 1 to 2, that is, each shift register includes one shift register unit. In this case, every adjacent six shift register units are connected to the first to sixth clock signal lines clk1, clk2, . . . , and clk6, respectively. Certainly, the display panel further includes 4 redundant shift registers, and each redundant shift register also includes one shift register unit, which is referred to as a redundant shift register unit. The 4 redundant shift register units are respectively connected to the first to fourth clock signal lines clk1, clk2, . . . , and clk4. The signal input terminal INPUT of a first shift register unit is connected to the frame start signal line, that is, the first shift register unit responds to the frame start signal. The signal output terminal OUTPUT of an M-th shift register unit is connected to the signal input terminal INPUT of an (M+1)-th shift register unit; where M takes 1 to p−1. The pull-up reset signal terminal of an L-th shift register unit is connected to the signal output terminal OUTPUT of an (L+2)-th shift register unit; where L takes 1 to p−2.

In addition, the signal output terminal OUTPUT of the p-th shift register unit is connected to the signal input terminal INPUT of the first redundant shift register unit; and the signal output terminal OUTPUT of a K-th redundant shift register unit is connected to the signal input terminal INPUT of a (K+1)-th redundant shift register unit; where K takes 1 to 3. The signal output terminals OUTPUT of the first and second redundant shift register units are connected to the pull-up reset signal terminals RESET_PU of (p−1)-th and p-th shift register units, respectively; and the signal output terminals OUTPUT of third and fourth redundant shift register units are connected to the pull-up reset signal terminals RESET_PU of the first and second redundant shift register units, respectively.

Figure 20:
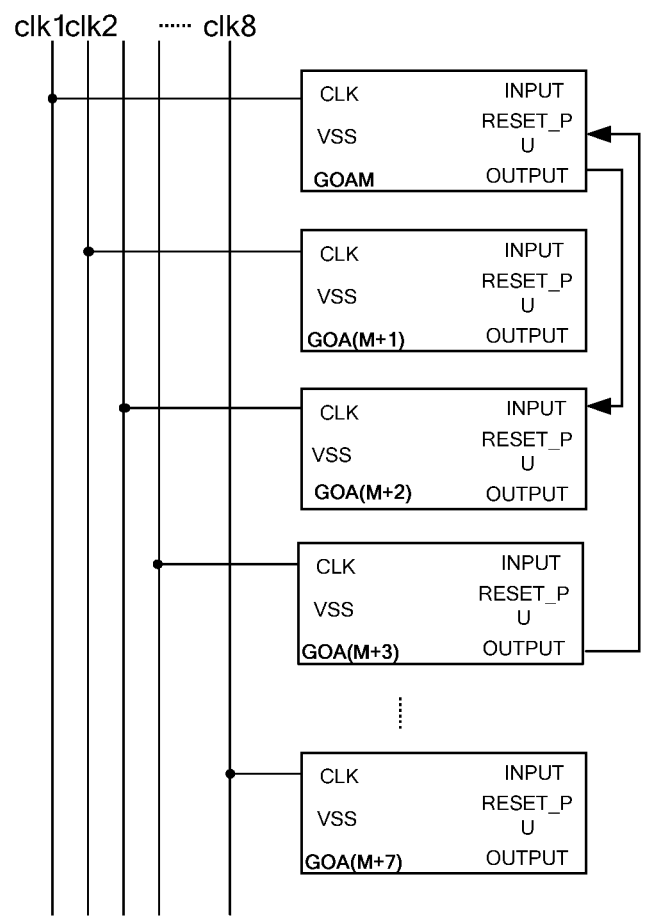
FIG. 20 is a schematic diagram of another cascade of shift registers in a case where the number of clock signal lines is 8 and a duty ratio of a clock signal is 30% according to an embodiment of the present disclosure.

For example, as shown in FIG. 20, the number N of the clock signal lines is equal to 8, the 8 clock signal lines are first to eighth clock signal lines clk1, clk2, . . . , and clk8, respectively, each group includes two rows of pixel units, and in this case, j takes 1 to 2, that is, each of the p shift registers includes one (e.g. only one) shift register unit and two sub signal output terminals OUTPUT. In this case, every adjacent eight shift register units are connected to the first to eighth clock signal lines clk1, clk2, . . . , and clk8, respectively. Certainly, the display panel further includes 6 redundant shift registers, and each redundant shift register also includes one (e.g. only one) redundant shift register unit. The 6 redundant shift register units are respectively connected to the first to sixth clock signal lines clk1, clk2, . . . , and clk6. The signal input terminals INPUT of both first and second shift register units are connected to the frame start signal line, that is, the first and second shift register units respond to the frame start signal. The signal output terminal OUTPUT of an M-th shift register unit is connected to the signal input terminal INPUT of an (M+2)-th shift register unit; where M takes 1 to p−2. The pull-up reset signal terminal RESET_PU of an L-th shift register unit is connected to the signal output terminal OUTPUT of an (L+3)-th shift register unit, and the pull-up reset signal of an L-th shift register unit is connected to the signal output terminal OUTPUT of the (L+3)-th shift register unit; where L takes 1 to p−3.

In addition, the signal output terminals OUTPUT of (p−1)-th and p-th shift register units are connected to the signal input terminals INPUT of first and second redundant shift register units, respectively; and the signal output terminal OUTPUT of a K-th redundant shift register unit is connected to the signal input terminal INPUT of a (K+2)-th redundant shift register unit; where K takes 1 to 4. The signal output terminals OUTPUT of the first to third redundant shift register units are connected to the pull-up reset signal terminals of (p−2)-th to p-th shift register units, respectively; and the signal output terminals OUTPUT of fourth to sixth redundant shift register units are connected to the pull-up reset signal terminals RESET_PU of the first to third redundant shift register units, respectively.

Figure 21:
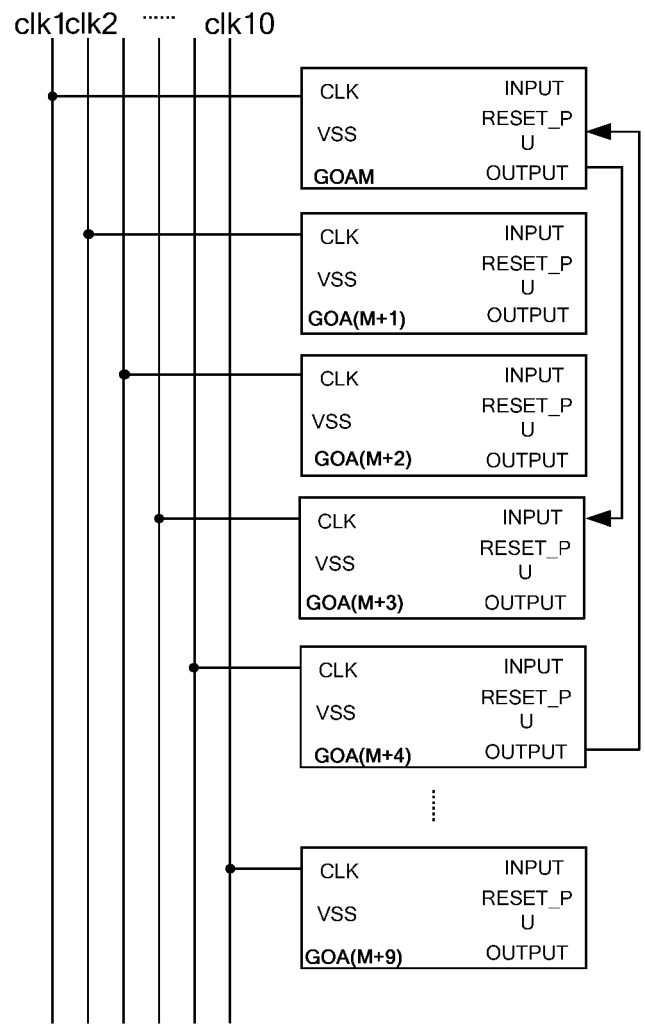
FIG. 21 is a schematic diagram of another cascade of shift registers in a case where the number of clock signal lines is 10 and a duty ratio of a clock signal is 30% according to an embodiment of the present disclosure.

For example, as shown in FIG. 21, the number N of the clock signal lines is equal to 10, the 10 clock signal lines are first to tenth clock signal lines clk1, clk2, . . . , and clk10, respectively, each group includes two rows of pixel units, and in this case, j takes 1 to 2, that is, each of the p shift register includes one (e.g., only one) shift register unit and two sub signal output terminals OUTPUT. In this case, every adjacent ten shift register units are connected to the first to tenth clock signal lines clk1, clk2, . . . , and clk10, respectively. Certainly, the display panel further includes 8 redundant shift registers, and each redundant shift register includes one (e.g., only one) redundant shift register unit. First to eighth redundant shift register units are respectively connected to the first to eighth clock signal lines clk1, clk2, . . . , and clk8. The signal input terminals INPUT of first to third shift register units are all connected to the frame start signal line, that is, the first to third shift register units respond to the frame start signal. The signal output terminal OUTPUT of an M-th shift register unit is connected to the signal input terminal INPUT of an (M+3)-th shift register unit; where M takes 1 to p−3. The pull-up reset signal terminal RESET_PU of an L-th shift register unit is connected to the signal output terminal OUTPUT of an (L+4)-th shift register unit; where L takes 1 to p−4.

In addition, the signal output terminals OUTPUT of (p−2)-th to p-th shift register units are connected to the signal input terminals INPUT of first to third redundant shift register units, respectively; and the signal output terminal OUTPUT of a K-th redundant shift register unit is connected to the signal input terminal INPUT of a (K+3)-th redundant shift register unit; where K takes 1 to 5. The signal output terminals OUTPUT of the first to fourth redundant shift register units are connected to the pull-up reset signal terminals RESET_PU of (p−3)-th to p-th shift register units, respectively; and the signal output terminals OUTPUT of fifth to eighth redundant shift register units are connected to the pull-up reset signal terminals RESET_PU of the first to fourth redundant shift register units, respectively.

In another exemplary embodiment, in a case where the number N of the clock signal lines is an even number greater than or equal to 4, and the duty ratio of the clock signal is 40%, the signal input terminals INPUT of shift register units of first to (N−2)/2-th shift registers respond to the frame start signal; the signal output terminal OUTPUT of an M-th shift register unit is connected to the signal input terminal INPUT of an [M+(N−2)/2]-th shift register unit; and the pull-up reset signal terminal RESET_PU of an L-th shift register unit is connected to the signal output terminal OUTPUT of an (L+N/2)-th shift register unit; where M takes 1 to p−(N−2)/2; and L takes 1 to p−N/2.

In addition, since the signal output terminal OUTPUT of the p-th shift register unit (which is the shift register unit in the last stage) is connected to the pull-up reset signal terminal RESET_PU of a (p−N/2)-th shift register unit, no shift register units provide a reset signal for the pull-up node PU of each of (p−N/2+1)-th to p-th shift register units. According to the above, for a reset signal for the pull-up node PU of the p-th shift register unit, the signal output terminal OUTPUT of a (p+N/2)-th shift register unit is required; at the same time, it is necessary to ensure that the (p+N/2)-th shift register unit can operate normally, and therefore N shift registers need to be added. Therefore, in some embodiments, N redundant shift registers are further provided in the display panel, the N redundant shift registers are connected to N clock signal lines, respectively, and each redundant shift register includes one redundant shift register unit (which is the same as the shift register unit in each shift register). The signal output terminals OUTPUT of first to N/2-th redundant shift register units are connected to the pull-up reset signal terminals RESET_PU of (p−N/2+1)-th to p-th shift register units, respectively; and the signal output terminals OUTPUT of (N/2+1)-th to N-th redundant shift register units are connected to the pull-up reset signal terminals RESET_PU of the first to (N/2)-th redundant shift register units, respectively.

It can be seen that the (p−N/2+1)-th to p-th shift registers are reset through signals output by the first to (N/2)-th redundant shift registers; at the same time, the first to (N/2)-th redundant shift registers are reset through signals output by the (N/2+1)-th to N-th redundant shift registers, so as to ensure normal operation of the first to (N/2)-th redundant shift registers.

A cascade relationship of shift registers will be described below by taking a case where the number N of clock signal lines is an even number greater than or equal to 4 and the duty ratio of the clock signal is 40% as an example.

Figure 22:
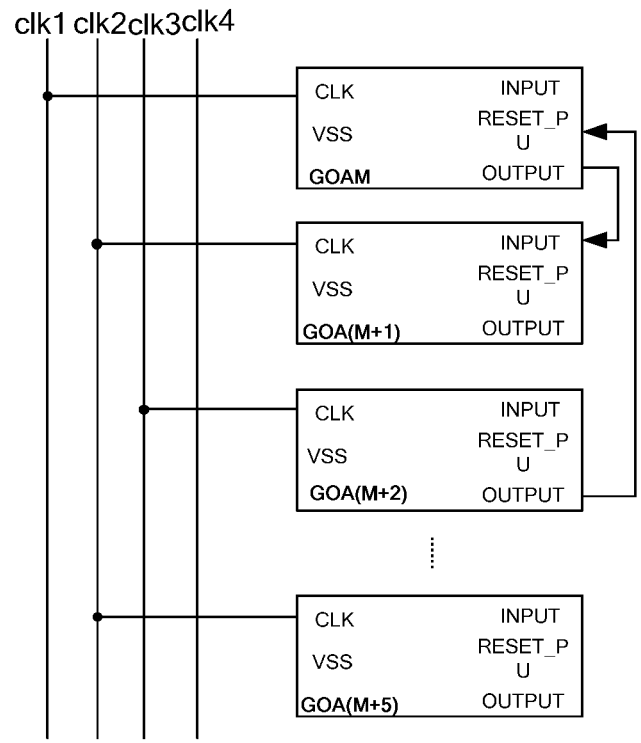
FIG. 22 is a schematic diagram of another cascade of shift registers in a case where the number of clock signal lines is 4 and a duty ratio of a clock signal is 40% according to an embodiment of the present disclosure.

For example, as shown in FIG. 22, the number N of the clock signal lines is equal to 4, the 4 clock signal lines are first to fourth clock signal lines clk1, clk2, . . . , and clk4, respectively, each group includes two rows of pixel units, and in this case, j takes 1 to 2, that is, each shift register includes one (e.g., only one) shift register unit and two sub signal output terminal OUTPUT. In this case, every adjacent four shift registers are connected to the first to fourth clock signal lines clk1, clk2, . . . , and clk4, respectively, and the two shift register units in each shift register are connected to a same clock signal line. Certainly, the display panel further includes 4 redundant shift registers, and each redundant shift register also includes one (e.g., only one) shift register unit. The 4 redundant shift register units are respectively connected to the first to fourth clock signal lines clk1, clk2, . . . , and clk4. The signal input terminals INPUT of two shift register units of a first shift register unit are both connected to the frame start signal line, that is, the first shift register unit responds to the frame start signal. The signal output terminal OUTPUT of an M-th shift register unit is connected to the signal input terminal INPUT of an (M+1)-th shift register unit; where M takes 1 to p−1. The pull-up reset signal terminal RESET_PU of an L-th shift register unit is connected to the signal output terminal OUTPUT of an (L+2)-th shift register unit; where L takes 1 to p−2.

In addition, the signal output terminal OUTPUT of the p-th shift register unit is connected to the signal input terminal INPUT of the first redundant shift register unit; and the signal output terminal OUTPUT of a K-th redundant shift register unit is connected to the signal input terminal INPUT of a (K+1)-th redundant shift register unit; where K takes 1 to 3. The signal output terminals OUTPUT of the first and second redundant shift register units are connected to the pull-up reset signal terminals RESET_PU of (p−1)-th and p-th shift register units, respectively; and the signal output terminals OUTPUT of third and fourth redundant shift register units are connected to the pull-up reset signal terminals RESET_PU of the first and second redundant shift register units, respectively.

Figure 23:
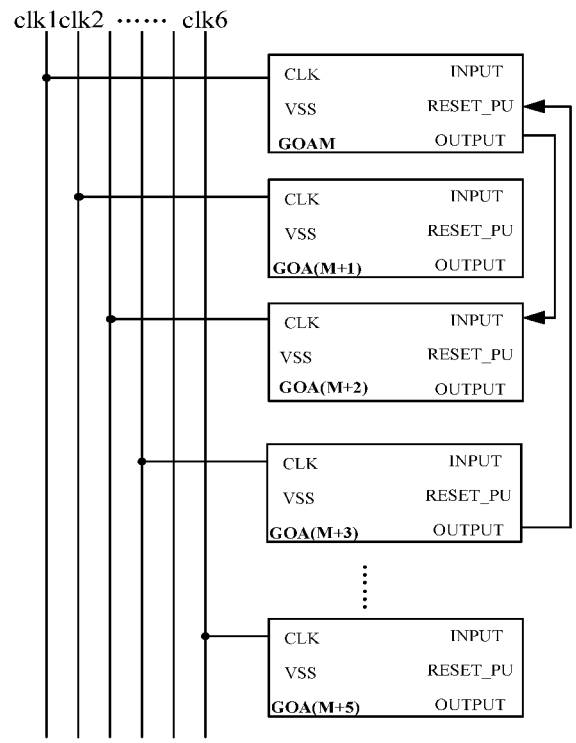
FIG. 23 is a schematic diagram of another cascade of shift registers in a case where the number of clock signal lines is 6 and a duty ratio of a clock signal is 40% according to an embodiment of the present disclosure.

For example, as shown in FIG. 23, the number N of the clock signal lines is equal to 6, the 6 clock signal lines are first to sixth clock signal lines clk1, clk2, . . . , and clk6, respectively, each group includes two rows of pixel units, and in this case, j takes 1 to 2, that is, each shift register includes one (e.g., only one) shift register unit and two sub signal output terminals OUTPUT. In this case, every adjacent six shift register units are connected to the first to sixth clock signal lines clk1, clk2, . . . , and clk6, respectively. Certainly, the display panel further includes 6 redundant shift registers, and each redundant shift register includes one (e.g., only one) redundant shift register unit. The 6 redundant shift register units are connected to the first to sixth clock signal lines clk1, clk2, . . . , and clk6, respectively. The signal input terminals INPUT of both first and second shift register units are connected to the frame start signal line, that is, the first and second shift register units respond to the frame start signal. The signal output terminal OUTPUT of an M-th shift register unit is connected to the signal input terminal INPUT of an (M+2)-th shift register unit; where M takes 1 to p−2. The pull-up reset signal terminal RESET_PU of an L-th shift register unit is connected to the signal output terminal OUTPUT of an (L+3)-th shift register unit; where L takes 1 to p−3.

In addition, the signal output terminals OUTPUT of (p−1)-th and p-th shift register units are connected to the signal input terminals INPUT of first and second redundant shift register units, respectively; and the signal output terminal OUTPUT of a K-th redundant shift register unit is connected to the signal input terminal INPUT of a (K+2)-th redundant shift register unit; where K takes 1 to 2. The signal output terminals OUTPUT of the first to third redundant shift register units are connected to the pull-up reset signal terminals RESET_PU of (p−2)-th to p-th shift register units, respectively; and the signal output terminals OUTPUT of fourth to sixth redundant shift register units are connected to the pull-up reset signal terminals RESET_PU of the first to third redundant shift register units, respectively.

Figure 24:
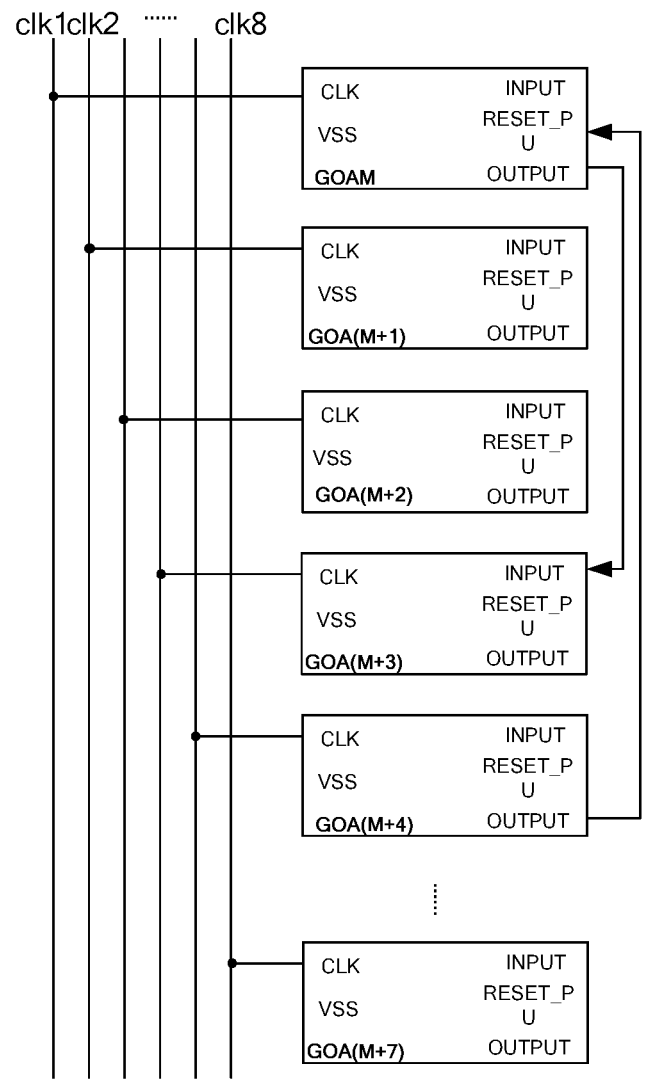
FIG. 24 is a schematic diagram of another cascade of shift registers in a case where the number of clock signal lines is 8 and a duty ratio of a clock signal is 40% according to an embodiment of the present disclosure.

For example, as shown in FIG. 24, the number N of the clock signal lines is equal to 8, the 8 clock signal lines are first to eighth clock signal lines clk1, clk2, . . . , and clk8, respectively, each group includes two rows of pixel units, and in this case, j takes 1 to 2, that is, each shift register includes one (e.g., only one) shift register unit and two sub signal output terminals OUTPUT. In this case, every adjacent eight shift register units are connected to the first to eighth clock signal lines clk1, clk2, . . . , and clk8, respectively. Certainly, the display panel further includes 8 redundant shift registers, and each redundant shift register includes one (e.g., only one) redundant shift register unit. The 8 redundant shift register units are respectively connected to the first to eighth clock signal lines clk1, clk2, . . . , and clk8, and two shift register units of each redundant shift register unit are connected to a same clock signal line. The signal input terminals INPUT of first to third shift register units are all connected to the frame start signal line, that is, the first to third shift register units respond to the frame start signal. The signal output terminal OUTPUT of an M-th shift register unit is connected to the signal input terminal INPUT of an (M+3)-th shift register unit; where M takes 1 to p−3. The pull-up reset signal terminal RESET_PU of an L-th shift register unit is connected to the signal output terminal OUTPUT of an (L+4)-th shift register unit; where L takes 1 to p−4.

In addition, the signal output terminals OUTPUT of (p−2)-th to p-th shift register units are connected to the signal input terminals INPUT of first to third redundant shift register units, respectively; and the signal output terminal OUTPUT of a K-th redundant shift register unit is connected to the signal input terminal INPUT of a (K+3)-th redundant shift register unit; where K takes 1 to 5. The signal output terminals OUTPUT of the first to fourth redundant shift register units are connected to the pull-up reset signal terminals RESET_PU of (p−3)-th to p-th shift register units, respectively; and the signal output terminals OUTPUT of fifth to eighth redundant shift register units are connected to the pull-up reset signal terminals RESET_PU of the first to fourth redundant shift register units, respectively.

Figure 25:
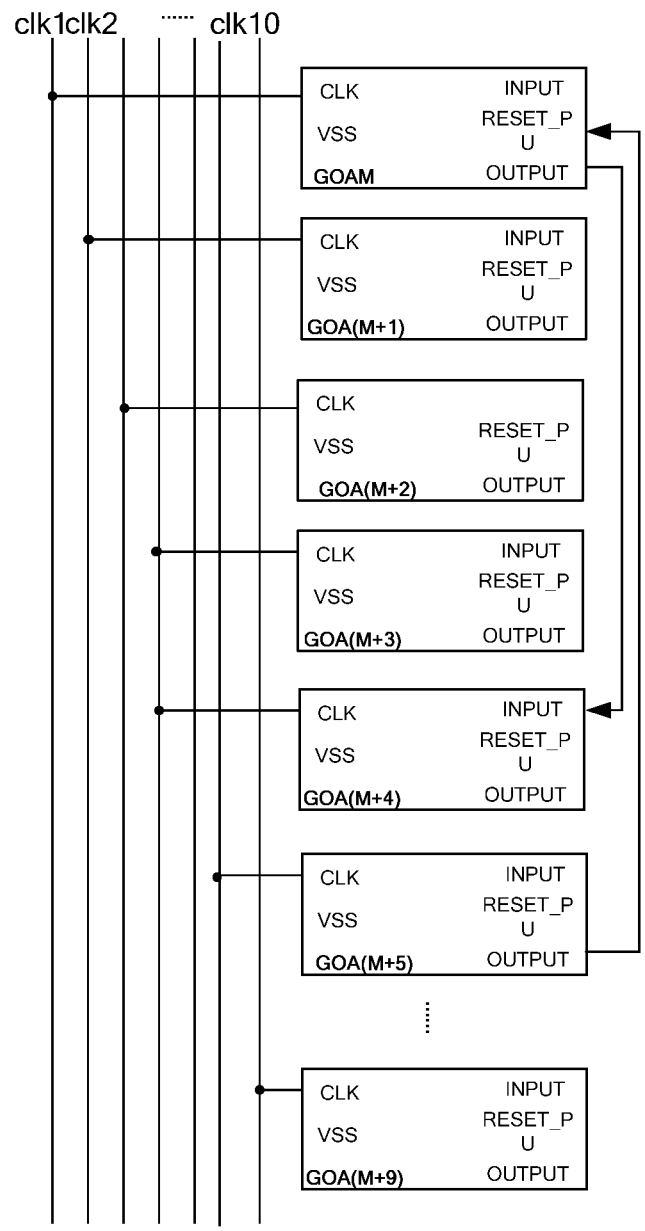
FIG. 25 is a schematic diagram of another cascade of shift registers in a case where the number of clock signal lines is 10 and a duty ratio of a clock signal is 40% according to an embodiment of the present disclosure.

For example, as shown in FIG. 25, the number N of the clock signal lines is equal to 10, the 10 clock signal lines are first to tenth clock signal lines clk1, clk2, . . . , and clk10, respectively, each group includes two rows of pixel units, and in this case, j takes 1 to 2, that is, each shift register includes one (e.g., only one) shift register unit and two sub signal output terminals OUTPUT. In this case, every adjacent tenth shift register units are connected to the first to tenth clock signal lines clk1, clk2, . . . , and clk10, respectively. Certainly, the display panel further includes 10 redundant shift registers, and each redundant shift register includes one (e.g., only one) redundant shift register unit. First to tenth redundant shift register units are connected to the first to tenth clock signal lines clk1, clk2, . . . , and clk10, respectively. The signal input terminals INPUT of first to fourth shift register units are all connected to the frame start signal line, that is, the first to fourth shift register units respond to the frame start signal. The signal output terminal OUTPUT of an M-th shift register unit is connected to the signal input terminal INPUT of an (M+4)-th shift register unit; where M takes 1 to p−4. The pull-up reset signal terminal RESET_PU of an L-th shift register unit is connected to the signal output terminal OUTPUT of an (L+5)-th shift register unit; where L takes 1 to p−5.

In addition, the signal output terminals OUTPUT of (p−3)-th to p-th shift register units are connected to the signal input terminals INPUT of the first to fourth redundant shift register units, respectively; and the signal output terminal OUTPUT of a K-th redundant shift register unit is connected to the signal input terminal INPUT of a (K+4)-th redundant shift register unit; where K takes 1 to 6. The signal output terminals OUTPUT of the first to fifth redundant shift register units are connected to the pull-up reset signal terminals RESET_PU of (p−4)-th to p-th shift register units, respectively; and the signal output terminals OUTPUT of sixth to tenth redundant shift register units are connected to the pull-up reset signal terminals RESET_PU of the first to fifth redundant shift register units, respectively.

In another exemplary embodiment, in a case where the number N of the clock signal lines is an even number greater than or equal to 4, and the duty ratio of the clock signal is 50%, the signal input terminals INPUT of shift register units of first to (N/2)-th shift registers respond to the frame start signal; the signal output terminal OUTPUT of an M-th shift register unit is connected to the signal input terminal INPUT of an (M+N/2)-th shift register unit; and the pull-up reset signal terminal RESET_PU of an L-th shift register unit is connected to the signal output terminal OUTPUT of an [L+(N/2+1)]-th shift register unit; where M takes 1 to p−N/2; and L takes 1 to p−(N/2+1).

In addition, since the signal output terminal OUTPUT of the p-th shift register unit (which is the shift register unit in the last stage) is connected to the pull-up reset signal terminal RESET_PU of a [p−(N/2+1)]-th shift register unit, no shift register units provide a reset signal for the pull-up node PU of each of (p−N/2)-th to p-th shift register units. According to the above, for a reset signal for the pull-up node PU of the p-th shift register unit, the signal output terminal OUTPUT of a (p+N/2+1)-th shift register unit is required; at the same time, it is necessary to ensure that the (p+N/2+1)-th shift register unit can operate normally, and therefore N+2 shift register units need to be added. Therefore, in some embodiments, N+2 redundant shift registers are further provided in the display panel, each redundant shift register includes one redundant shift register unit (which is the same as the shift register unit in each shift register), first to N-th redundant shift register units of the N+2 redundant shift register units are connected to the N clock signal lines, respectively, and (N+1)-th and (N+2)-th redundant shift register units of the N+2 redundant shift register units are connected to the first and second clock signal line, respectively. The signal output terminals OUTPUT of first to (N/2+1)-th redundant shift register units are connected to the pull-up reset signal terminals RESET_PU of (p−N/2)-th to p-th shift register units, respectively; and the signal output terminals OUTPUT of the (N/2+2)-th to (N+2)-th redundant shift register units are connected to the pull-up reset signal terminals RESET_PU of the first to (N/2+1)-th redundant shift register units, respectively.

It can be seen that the (p−N/2)-th to p-th shift registers are reset through signals output by the first to (N/2+1)-th redundant shift registers; at the same time, the first to (N/2+1)-th redundant shift registers are reset through signals output by the (N/2+2)-th to (N+2)-th redundant shift registers, so as to ensure normal operation of the first to (N/2+1)-th redundant shift registers.

A cascade relationship of shift registers will be described below by taking a case where the number N of clock signal lines is an even number greater than or equal to 4 and the duty ratio of the clock signal is 50% as an example.

Figure 26:
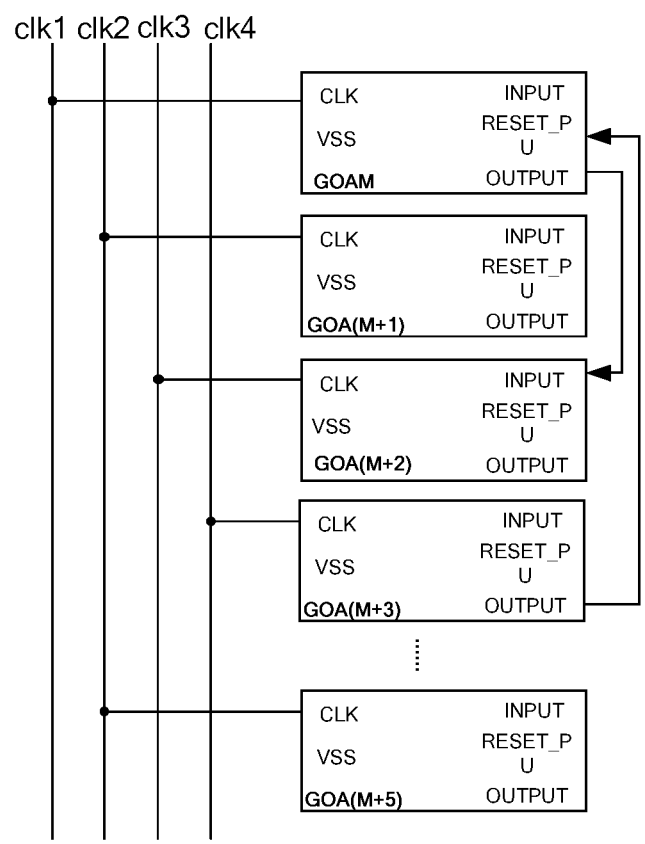
FIG. 26 is a schematic diagram of another cascade of shift registers in a case where the number of clock signal lines is 4 and a duty ratio of a clock signal is 50% according to an embodiment of the present disclosure.

For example, as shown in FIG. 26, the number N of the clock signal lines is equal to 4, the 4 clock signal lines are first to fourth clock signal lines clk1, clk2, and clk4, respectively, each group includes two rows of pixel units, and in this case, j takes 1 to 2, that is, each shift register includes one (e.g., only one) shift register unit. In this case, every adjacent four shift register units are connected to the first to fourth clock signal lines clk1, clk2, . . . , and clk4, respectively. Certainly, the display panel further includes 6 redundant shift registers, and each redundant shift register also includes one (e.g., only one) redundant shift register unit. First to fourth redundant shift register units of the 6 redundant shift register units are connected to the first to fourth clock signal lines clk1, clk2, . . . , and clk4, respectively, and fifth and sixth redundant shift register units of the 6 redundant shift register units are connected to the first and second clock signal lines clk1 and clk2, respectively. The signal input terminals INPUT of both first and second shift register units are connected to the frame start signal line, that is, the first and second shift register units respond to the frame start signal. The signal output terminal OUTPUT of an M-th shift register unit is connected to the signal input terminal INPUT of an (M+2)-th shift register unit; where M takes 1 to p−2. The pull-up reset signal terminal RESET_PU of an L-th shift register unit is connected to the signal output terminal OUTPUT of an (L+3)-th shift register unit; where L takes 1 to p−3.

In addition, the signal output terminals OUTPUT of (p−1)-th and p-th shift register units are connected to the signal input terminals INPUT of the first and second redundant shift register unit, respectively; and the signal output terminal OUTPUT of a K-th redundant shift register unit is connected to the signal input terminal INPUT of a (K+2)-th redundant shift register unit; where K takes 1 to 4. The signal output terminals OUTPUT of the first to third redundant shift register units are connected to the pull-up reset signal terminals RESET_PU of (p−2)-th to p-th shift register units, respectively; and the signal output terminals OUTPUT of fourth to sixth redundant shift register units are connected to the pull-up reset signal terminals RESET_PU of the first to third redundant shift register units, respectively.

Figure 27:
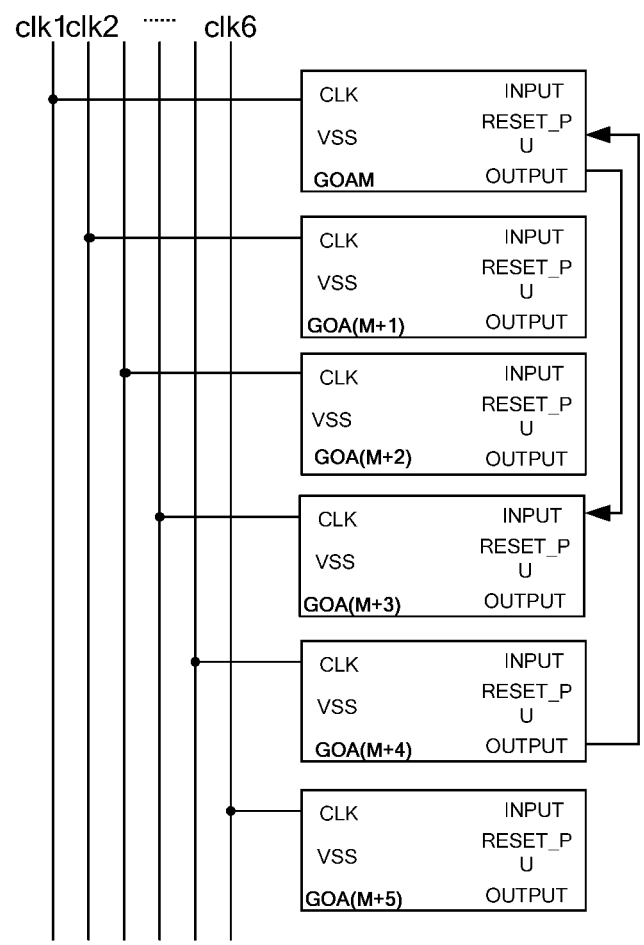
FIG. 27 is a schematic diagram of another cascade of shift registers in a case where the number of clock signal lines is 6 and a duty ratio of a clock signal is 50% according to an embodiment of the present disclosure.

For example, as shown in FIG. 27, the number N of the clock signal lines is equal to 6, the 6 clock signal lines are first to sixth clock signal lines clk1, clk2, . . . , and clk6, respectively, each group includes two rows of pixel units, and in this case, j takes 1 to 2, that is, each shift register includes one (e.g., only one) shift register unit and two sub signal output terminals OUTPUT. In this case, every adjacent six shift register units are connected to the first to sixth clock signal lines clk1, clk2, . . . , and clk6, respectively. Certainly, the display panel further includes 8 redundant shift registers, and each redundant shift register includes one (e.g., only one) redundant shift register unit. First to sixth redundant shift register units of the 8 redundant shift register units are connected to the first to sixth clock signal lines clk1, clk2, . . . , and clk6, respectively, and seventh and eighth redundant shift register units of the 8 redundant shift register units are connected to the first and second clock signal lines clk1 and clk2, respectively. The signal input terminals INPUT of both first and second shift register units are connected to the frame start signal line, that is, the first and second shift register units respond to the frame start signal. The signal output terminal OUTPUT of an M-th shift register unit is connected to the signal input terminal INPUT of an (M+3)-th shift register unit; where M takes 1 to p−3. The pull-up reset signal terminal RESET_PU of an L-th shift register unit is connected to the signal output terminal OUTPUT of an (L+4)-th shift register unit; where L takes 1 to p−4.

In addition, the signal output terminals OUTPUT of (p−2)-th to p-th shift register units are connected to the signal input terminals INPUT of the first to third redundant shift register units, respectively; and the signal output terminal OUTPUT of a first redundant shift register unit in a K-th redundant shift register is connected to the signal input terminal INPUT of a first redundant shift register unit in a (K+3)-th redundant shift register; where K takes 1 to 3. The signal output terminals OUTPUT of the first to fourth redundant shift register units are connected to the pull-up reset signal terminals RESET_PU of (p−3)-th to p-th shift register units, respectively; and the signal output terminals OUTPUT of fifth to eighth redundant shift register units are connected to the pull-up reset signal terminals RESET_PU of the first to fourth redundant shift register units, respectively.

Figure 28:
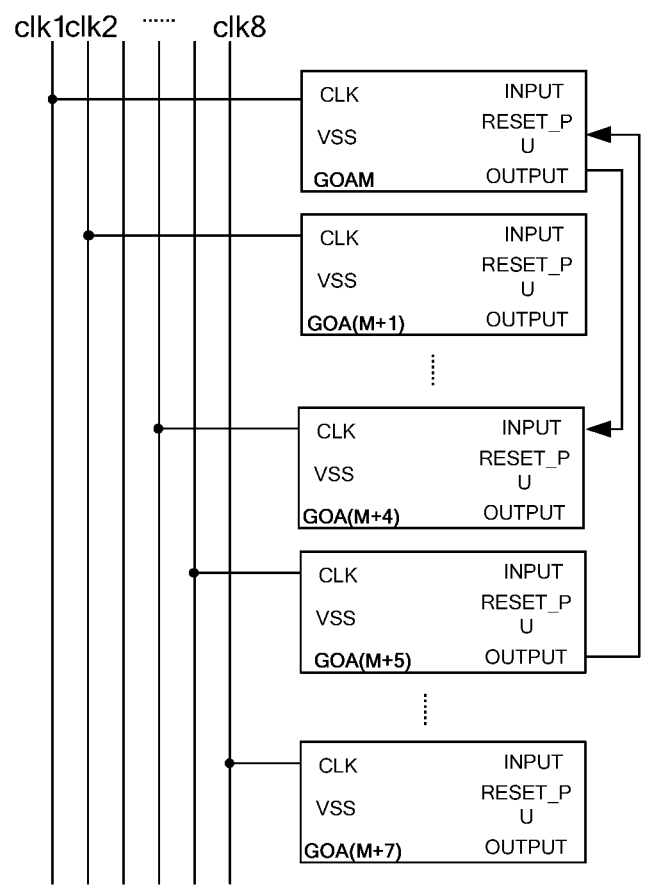
FIG. 28 is a schematic diagram of another cascade of shift registers in a case where the number of clock signal lines is 8 and a duty ratio of a clock signal is 50% according to an embodiment of the present disclosure.

For example, as shown in FIG. 28, the number N of the clock signal lines is equal to 8, the 8 clock signal lines are first to eighth clock signal lines clk1, clk2, . . . , and clk8, respectively, each group includes two rows of pixel units, and in this case, j takes 1 to 2, that is, each shift register includes one (e.g., only one) shift register unit and two sub signal output terminals OUTPUT. In this case, every adjacent eight shift register units are connected to the first to eighth clock signal lines clk1, clk2, . . . , and clk8, respectively. Certainly, the display panel further includes 10 redundant shift registers, and each redundant shift register includes one (e.g., only one) redundant shift register unit. First to eighth redundant shift register units of the 10 redundant shift register units are connected to the first to eighth clock signal lines clk1, clk2, and clk8, respectively, and ninth and tenth redundant shift register units of the 10 redundant shift register units are connected to the first and second clock signal lines clk1 and clk2, respectively. The signal input terminals INPUT of first to fourth shift register units are all connected to the frame start signal line, that is, the first to fourth shift register units respond to the frame start signal. The signal output terminal OUTPUT of an M-th shift register unit is connected to the signal input terminal INPUT of an (M+4)-th shift register unit; where M takes 1 to p−4. The pull-up reset signal terminal RESET_PU of an L-th shift register unit is connected to the signal output terminal OUTPUT of an (L+5)-th shift register unit; where L takes 1 to p−5.

In addition, the signal output terminals OUTPUT of (p−3)-th to p-th shift register units are connected to the signal input terminals INPUT of the first to fourth redundant shift register units, respectively; and the signal output terminal OUTPUT of a K-th redundant shift register unit is connected to the signal input terminal INPUT of a (K+4)-th redundant shift register unit; where K takes 1 to 6. The signal output terminals OUTPUT of the first to fifth redundant shift register units are connected to the pull-up reset signal terminals RESET_PU of (p−4)-th to p-th shift register units, respectively; and the signal output terminals OUTPUT of sixth to tenth redundant shift register units are connected to the pull-up reset signal terminals RESET_PU of the first to fifth redundant shift register units, respectively.

Figure 29:
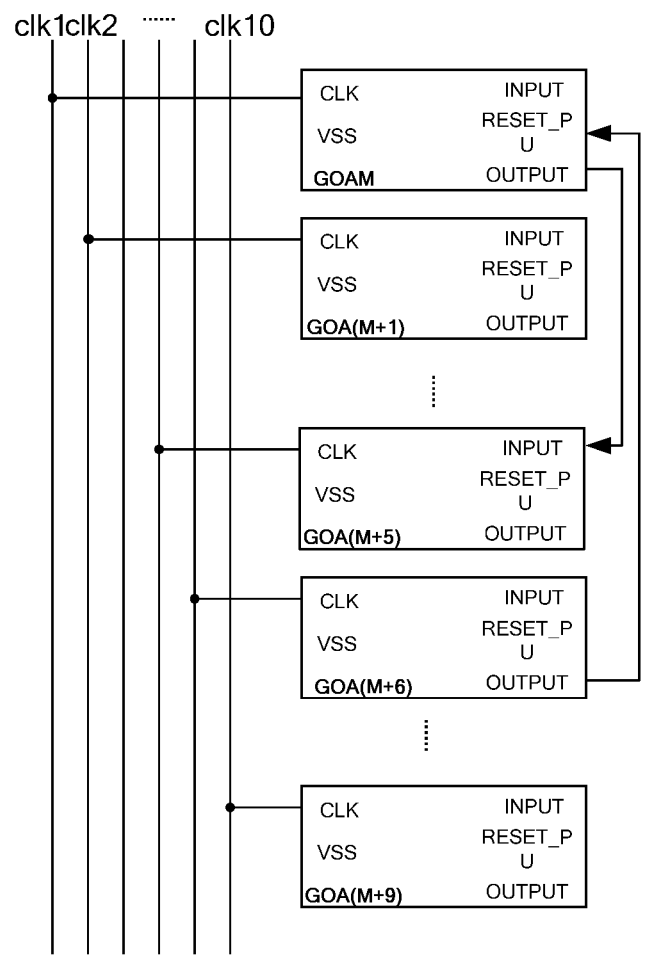
FIG. 29 is a schematic diagram of another cascade of shift registers in a case where the number of clock signal lines is 10 and a duty ratio of a clock signal is 50% according to an embodiment of the present disclosure.

For example, as shown in FIG. 29, the number N of the clock signal lines is equal to 10, the 10 clock signal lines are first to tenth clock signal lines clk1, clk2, . . . , and clk10, respectively, each group includes two rows of pixel units, and in this case, j takes 1 to 2, that is, each shift register includes one (e.g., only one) shift register unit and two sub signal output terminals OUTPUT. In this case, every adjacent tenth shift register units are connected to the first to tenth clock signal lines clk1, clk2, . . . , and clk10, respectively. Certainly, the display panel further includes 12 redundant shift registers, and each redundant shift register includes one (e.g., only one) redundant shift register unit. First to tenth redundant shift register units of the 12 redundant shift register units are connected to the first to tenth clock signal lines clk1, clk2, . . . , and clk10, respectively, and eleventh and twelfth redundant shift register units of the 12 redundant shift register units are connected to the first and second clock signal lines clk1 and clk2, respectively. The signal input terminals INPUT of first to fifth shift register units are all connected to the frame start signal line, that is, the first to fifth shift register units respond to the frame start signal. The signal output terminal OUTPUT of an M-th shift register unit is connected to the signal input terminal INPUT of an (M+5)-th shift register unit; where M takes 1 to p−5. The pull-up reset signal terminal RESET_PU of an L-th shift register unit is connected to the signal output terminal OUTPUT of an (L+6)-th shift register unit; where L takes 1 to p−6.

In addition, the signal output terminals OUTPUT of (p−4)-th to p-th shift register units are connected to the signal input terminals INPUT of the first to fifth redundant shift register units, respectively; the signal output terminal OUTPUT of a K-th redundant shift register unit is connected to the signal input terminal INPUT of a (K+5)-th redundant shift register unit; where K takes 1 to 7. The signal output terminals OUTPUT of the first to sixth redundant shift register units are connected to the pull-up reset signal terminals RESET_PU of (p−5)-th to p-th shift register units, respectively; and the signal output terminals OUTPUT of seventh to twelfth redundant shift register units are connected to the pull-up reset signal terminals RESET_PU of the first to sixth redundant shift register units, respectively.

In a second aspect, an embodiment of the present disclosure provides a display device, which includes any one of the display panels as described above.

The display device may be any product or component with a display function, such as a mobile phone, a tablet computer, a television, a display, a notebook computer, a digital photo frame, a navigator, or the like.

Certainly, the display device of the embodiment may also include other conventional structures, such as a power supply, a display driver, and/or the like.

It could be understood that the above implementations are only exemplary implementations adopted to illustrate the principle of the present disclosure, but the present disclosure is not limited thereto. For one of ordinary skill in the art, various modifications and improvements can be made without departing from the spirit and essence of the present disclosure, and these modifications and improvements are also regarded as falling into the protection scope of the present disclosure.

What is claimed is:

1. A display panel, comprising p pixel unit groups, each of the p pixel unit groups comprising q rows of pixel units, both p and q being integers greater than or equal to 2; wherein pixel units in a same group are simultaneously supplied with a gate scan signal by a same shift register; and pixel units in a same group and in a same column are supplied with data voltage signals through different data lines, respectively;

the display panel further comprises N clock signal lines, N being an even number greater than or equal to 4, and p being greater than or equal to 2N; wherein each shift register is connected to one of the N clock signal lines, shift registers connected to different clock signal lines are different, and the q rows of pixel units in each group are adjacent to each other;

wherein pixel units in a same row are connected to a same gate line; each shift register comprises q shift register units, and the shift register units are connected to gate lines in one-to-one correspondence; and wherein each shift register unit comprises a cascade signal output terminal and a signal output terminal, a signal output by the cascade signal output terminal and a signal output by the signal output terminal are the same as each other and are synchronous, the cascade signal output terminal is configured to be connected to a pull-up reset signal terminal of a shift register unit in a previous stage and a signal input terminal of a shift register unit in a next stage, and the signal output terminal is configured to be connected to a corresponding gate line.

2. The display panel of claim 1, wherein each shift register unit is connected to one of the N clock signal lines through one signal connection line, and different shift register units are connected with different signal connection lines; or wherein the q shift register units in each shift register are connected to a corresponding clock signal line through a same signal connection line, and a plurality of shift register units in different shift registers are connected with different signal connection lines, respectively.

3. The display panel of claim 1, wherein each shift register unit comprises at least an input sub-circuit, an output sub-circuit, and a pull-up reset sub-circuit; wherein the input sub-circuit inputs, in response to an input signal input from a signal input terminal, the input signal to a pull-up node; the output sub-circuit outputs a clock signal input by a corresponding clock signal line through a signal output terminal in response to a potential of the pull-up node; and the pull-up reset sub-circuit resets the potential of the pull-up node through a turn-off level signal in response to a pull-up reset signal input from a pull-up reset signal terminal; and every adjacent N shift registers are connected to the N clock signal lines in one-to-one correspondence, and an i-th shift register and an (i+N)-th shift register are connected to a same clock signal line, where i takes 1 to p−N.

4. The display panel of claim 3, wherein in a case where a duty ratio of the clock signal is 30%, and N is an even number greater than or equal to 6, a signal input terminal of each shift register unit in first to (N−4)/2 shift registers responds to a frame start signal;

a signal output terminal of a j-th shift register unit in an M-th shift register is connected to a signal input terminal of a j-th shift register unit in an [M+(N−4)/2]-th shift register; and a pull-up reset signal terminal of a j-th shift register unit in an L-th shift register is connected to a signal output terminal of a j-th shift register unit in an [L+(N/2−1)]-th shift register; where M takes 1 to p−(N−4)/2; L takes 1 to p−(N/2−1); and j takes 1 to q.

5. The display panel of claim 4, further comprising N−2 redundant shift registers, wherein the N−2 redundant shift registers are connected to N−2 clock signal lines, respectively, and each redundant shift register comprises q redundant shift register units; each redundant shift register unit has the same structure as each shift register unit; wherein signal output terminals of j-th redundant shift register units in first to (N/2−1)-th redundant shift registers are connected to pull-up reset signal terminals of j-th shift register units in [p−(N/2−2)]-th to p-th shift registers, respectively; and signal output terminals of j-th redundant shift register units in N/2-th to (N−2)-th redundant shift registers are connected to pull-up reset signal terminals of the j-th redundant shift register units in the first to (N/2−1)-th redundant shift registers, respectively.

6. The display panel of claim 3, wherein in a case where a duty ratio of the clock signal is 40%, and N is an even number greater than or equal to 4;

a signal input terminal of each shift register unit in first to (N−2)/2 shift registers responds to a frame start signal;

a signal output terminal of a j-th shift register unit in an M-th shift register is connected to a signal input terminal of a j-th shift register unit in an [M+(N−2)/2]-th shift register; and a pull-up reset signal terminal of a j-th shift register unit in an L-th shift register is connected to a signal output terminal of a j-th shift register unit in an (L+N/2)-th shift register; where M takes 1 to p−(N−2)/2; L takes 1 to p−N/2; and j takes 1 to q.

7. The display panel of claim 6, further comprising N redundant shift registers, wherein the N redundant shift registers are connected to the N clock signal lines, respectively; each redundant shift register comprises q redundant shift register units; each redundant shift register unit has the same structure as each shift register unit; wherein signal output terminals of j-th redundant shift register units in first to (N/2)-th redundant shift registers are connected to pull-up reset signal terminals of j-th shift register units in (p−N/2+1)-th to p-th shift registers, respectively; and signal output terminals of j-th redundant shift register units in (N/2+1)-th to N-th redundant shift registers are connected to pull-up reset signal terminals of the j-th redundant shift register units in the first to (N/2)-th redundant shift registers, respectively.

8. The display panel of claim 3, wherein in a case where a duty ratio of the clock signal is 50%, and N is an even number greater than or equal to 4;

a signal input terminal of each shift register unit in first to N/2 shift registers responds to a frame start signal;

a signal output terminal of a j-th shift register unit in an M-th shift register is connected to a signal input terminal of a j-th shift register unit in an (M+N/2)-th shift register; and a pull-up reset signal terminal of a j-th shift register unit in an L-th shift register is connected to a signal output terminal of a j-th shift register unit in an [L+(N/2+1)]-th shift register; where M takes 1 to p−N/2; L takes 1 to p−(N/2+1); and j takes 1 to q.

9. The display panel of claim 8, further comprising N+2 redundant shift registers, wherein first to N-th redundant shift registers of the N+2 redundant shift registers are connected to the N clock signal lines, respectively, and (N+1)-th and (N+2)-th redundant shift registers of the N+2 redundant shift registers are connected to first and second clock signal lines, respectively; each of the N redundant shift registers comprises q redundant shift register units; each redundant shift register unit has the same structure as each shift register unit; wherein signal output terminals of j-th redundant shift register units in first to (N/2+1)-th redundant shift registers are connected to pull-up reset signal terminals of j-th shift register units in (p−N/2)-th to p-th shift registers, respectively; and signal output terminals of j-th redundant shift register units in (N/2+2)-th to (N+2)-th redundant shift registers are connected to pull-up reset signal terminals of the j-th redundant shift register units in the first to (N/2+1)-th redundant shift registers, respectively.

10. The display panel of claim 1, wherein pixel units in a same row are connected to a same gate line; each shift register comprises one shift register unit and q sub signal output terminals connected to a signal output terminal of the shift register unit, and the sub signal output terminals are connected to gate lines in one-to-one correspondence.

11. The display panel of claim 10, wherein each shift register unit comprises at least an input sub-circuit, an output sub-circuit, and a pull-up reset sub-circuit; wherein the input sub-circuit inputs, in response to an input signal input from a signal input terminal, the input signal to a pull-up node; the output sub-circuit inputs a clock signal input through a corresponding clock signal line to a signal output terminal in response to a potential of the pull-up node, so that the signal output terminal outputs the clock signal through the q sub signal output terminals; the pull-up reset sub-circuit resets the potential of the pull-up node through a turn-off level signal in response to a pull-up reset signal input from a pull-up reset signal terminal; and every adjacent N shift register units are connected to the N clock signal lines in one-to-one correspondence, and an i-th shift register unit and an (i+N)-th shift register unit are connected to a same clock signal line, where i takes 1 to p−N.

12. The display panel of claim 11, wherein in a case where a duty ratio of the clock signal is 30%, and N is an even number greater than or equal to 6, signal input terminals of first to (N−4)/2 shift register units respond to a frame start signal;

a signal output terminal of an M-th shift register unit is connected to a signal input terminal of an [M+(N−4)/2]-th shift register unit; and a pull-up reset signal terminal of an L-th shift register unit is connected to a signal output terminal of an [L+(N/2−1)]-th shift register unit; where M takes 1 to p−(N−4)/2; and L takes 1 to p−(N/2−1).

13. The display panel of claim 12, further comprising N−2 redundant shift registers, wherein the N−2 redundant shift registers are connected to N−2 clock signal lines, respectively, and each redundant shift register comprises one redundant shift register unit; the redundant shift register unit has the same structure as the shift register unit; wherein signal output terminals of first to (N/2−1)-th redundant shift register units are connected to pull-up reset signal terminals of [p−(N/2−2)]-th to p-th shift register units, respectively; and signal output terminals of N/2-th to (N−2)-th redundant shift register units are connected to pull-up reset signal terminals of the first to (N/2−1)-th redundant shift register units, respectively.

14. The display panel of claim 11, wherein in a case where a duty ratio of the clock signal is 40%, and N is an even number greater than or equal to 4;

signal input terminals of first to (N−2)/2 shift register units responds to a frame start signal;

a signal output terminal of an M-th shift register unit is connected to a signal input terminal of an [M+(N−2)/2]-th shift register unit; and a pull-up reset signal terminal of an L-th shift register unit is connected to a signal output terminal of an (L+N/2)-th shift register unit; where M takes 1 to p−(N−2)/2; and L takes 1 to p−N/2.

15. The display panel of claim 14, further comprising N redundant shift registers, wherein the N redundant shift registers are connected to the N clock signal lines, respectively; each redundant shift register comprises one redundant shift register unit; each redundant shift register unit has the same structure as each shift register unit; wherein signal output terminals of first to (N/2)-th redundant shift register units are connected to pull-up reset signal terminals of (p−N/2+1)-th to p-th shift register units, respectively; and signal output terminals of (N/2+1)-th to N-th redundant shift register units are connected to pull-up reset signal terminals of the first to (N/2)-th redundant shift register units, respectively.

16. The display panel of claim 11, wherein in a case where a duty ratio of the clock signal is 50%, and N is an even number greater than or equal to 4;

signal input terminals of first to N/2 shift register units responds to a frame start signal;

a signal output terminal of an M-th shift register unit is connected to a signal input terminal of an (M+N/2)-th shift register unit; and a pull-up reset signal terminal of an L-th shift register unit is connected to a signal output terminal of an [L+(N/2+1)]-th shift register unit; where M takes 1 to p−N/2; and L takes 1 to p−(N/2+1).

17. The display panel of claim 16, further comprising N+2 redundant shift registers, wherein first to N-th redundant shift registers of the N+2 redundant shift registers are connected to the N clock signal lines, respectively, and (N+1)-th and (N+2)-th redundant shift registers of the N+2 redundant shift registers are connected to first and second clock signal lines, respectively; each redundant shift register comprises one redundant shift register unit; each redundant shift register unit has the same structure as each shift register unit; wherein signal output terminals of first to (N/2+1)-th redundant shift register units are connected to pull-up reset signal terminals of (p−N/2)-th to p-th shift register units, respectively; and signal output terminals of (N/2+2)-th to (N+2)-th redundant shift register units are connected to pull-up reset signal terminals of the first to (N/2+1)-th redundant shift register units, respectively.

18. A display device, comprising the display panel of claim 1.

* * * * *